(12) United States Patent
Allan et al.

(10) Patent No.: US 6,806,039 B2
(45) Date of Patent: Oct. 19, 2004

(54) PHOTOLITHOGRAPHIC ELEMENT BLANK CALCIUM STRONTIUM FLUORIDE UV TRANSMITTING MIXED FLUORIDE CRYSTAL WITH MINIMIZED SPATIAL DISPERSION

(75) Inventors: Douglas C. Allan, Corning, NY (US); Nicholas F. Borrelli, Elmira, NY (US); Charlene M. Smith, Corning, NY (US); Robert W. Sparrow, Sturbridge, MA (US)

(73) Assignee: Corning Incorporated, Corning, NY (US)

( * ) Notice: Subject to any disclaimer, the term of this patent is extended or adjusted under 35 U.S.C. 154(b) by 118 days.

(21) Appl. No.: 10/242,887

(22) Filed: Sep. 13, 2002

(65) Prior Publication Data

US 2003/0104318 A1 Jun. 5, 2003

Related U.S. Application Data

(60) Provisional application No. 60/408,331, filed on Sep. 4, 2002, and provisional application No. 60/322,408, filed on Sep. 14, 2001.

(51) Int. Cl.⁷ .................... C01F 11/22; C30B 17/00
(52) U.S. Cl. .............. 430/320; 430/321; 430/311; 423/490; 423/497; 117/73; 117/940; 428/696; 428/697; 359/796; 385/132; 385/134
(58) Field of Search ................ 430/311, 320, 430/321; 423/490, 497; 117/73, 940; 428/696, 697; 359/796; 385/132, 134

(56) References Cited

U.S. PATENT DOCUMENTS

| | | |
|---|---|---|
| 5,147,742 A | 9/1992 | Ban et al. |
| 6,061,174 A | 5/2000 | Shiozawa et al. |
| 6,226,128 B1 | 5/2001 | Shiozawa |
| 6,342,312 B2 * | 1/2002 | Oba et al. .................. 428/696 |

* cited by examiner

*Primary Examiner*—John A. McPherson
*Assistant Examiner*—Daborah Chacko-Davis
(74) *Attorney, Agent, or Firm*—Walter M. Douglas; Edward F. Murphy

(57) ABSTRACT

The invention provides a UV below 200 nm lithography method utilizing mixed calcium strontium fluoride crystals. The invention includes providing a below 200 nm radiation source for producing <200-nm light, providing a plurality of mixed calcium strontium cubic fluoride crystal optical elements, with the fluoride crystals comprised of a combination of calcium strontium cations having different optical polarizabilities such as to produce an overall isotropic polarizability which minimizes the fluoride crystal spatial dispersion below 200 nm, transmitting <200-nm light through the cubic fluoride crystal optical elements, forming a lithography pattern with the light, reducing the lithography pattern and projecting the lithography pattern with the fluoride crystal optical elements onto a UV radiation sensitive lithography printing medium to form a printed lithographic pattern. The invention includes making the mixed fluoride crystals, optical element blanks thereof and optical lithography elements.

23 Claims, 15 Drawing Sheets

FIG. 6  $Ca_xSr_{(1-x)}F_2$

FIG. 7 VUV TRANSMISSION of $CaF_2$ and $Ca_xSr_{(1-x)}F_2$ for x = 0.0, 0.1, 0.4, 0.8

FIG. 8 TRANSMISSION OF $Ca_{0.8}Sr_{0.2}F_2$ THROUGH 16 mm AND 48 mm PATHLENGTH

FIG. 9  $Ca_{0.2}Sr_{0.8}F_2$ EXPOSED TO $0.96 \times 10^6$ PULSES, 193 nm, 17.5 mJ/cm$_2$ FIG. 10 193nm EXCITED FLUORESCENCE SPECTRUM $Ca_{0.2}Sr_{(1-x)}F_2$ SAMPLE v. REFERENCE SAMPLE OF $CaF_2$

PHOTOLITHOGRAPHIC ELEMENT BLANK CALCIUM STRONTIUM FLUORIDE UV TRANSMITTING MIXED FLUORIDE CRYSTAL WITH MINIMIZED SPATIAL DISPERSION

RELATED APPLICATIONS

This application claims the benefit of U.S. Provisional Application Ser. No. 60/408,331, filed Sep. 4, 2002 entitled PHOTOLITHOGRAPHIC ELEMENT BLANK CALCIUM STRONTIUM FLUORIDE UV TRANSMITTING MIXED FLUORIDE CRYSTAL WITH MINIMIZED SPATIAL DISPERSION, by D. C. Allan, N. F. Borrelli, C. M. Smith and R. W. Sparrow. This application claims the benefit of U.S. Provisional Application Ser. No. 60/322,408, filed Sep. 14, 2001 entitled PHOTOLITHOGRAPHIC METHOD AND UV TRANSMITTING FLUORIDE CRYSTALS WITH MINIMIZED SPATIAL DISPERSION, by D. C. Allan, N. F. Borrelli, C. M. Smith and R. W. Sparrow.

BACKGROUND OF THE INVENTION

1. Field of the Invention

The present invention relates generally to optical projection lithography methods and photolithography, and particularly to calcium strontium mixed fluoride crystals with minimal spatial dispersion for use in optical photolithography systems utilizing ultraviolet light (UV) wavelengths below 200 nm, such as UV lithography systems utilizing wavelengths in the 193 nm region and the 157 nm region.

2. Technical Background

Projection optical photolithography methods/systems that utilize the ultraviolet wavelengths of light below 200 nm provide benefits in terms of achieving smaller feature dimensions. Such methods/systems that utilize ultraviolet wavelengths in the 157 nm and the 193 nm wavelength regions have the potential of improving the manufacturing of integrated circuits with smaller feature sizes. The commercial use and adoption of below 200 nm UV in high volume mass production of integrated circuits hinges on the availability of economically manufacturable optical fluoride crystals with high quality optical performance.

Fluoride crystals for use below 200-nm must have high internal transmission at the use wavelength (>98%/cm), high index of refraction homogeneity (<2 ppm) and low residual stress birefringence (<3 nm/cm). Stress birefringence is a consequence of the manufacturing process and can be minimized through careful annealing of the crystal. While the crystals typically used for these applications are cubic and so exhibit symmetric properties with respect to the crystal axes, they are not isotropic as for example, glass is. This distinction becomes clear when addressing a property called "spatial dispersion". Spatial dispersion is a property that is described as the presence of birefringence that is dependent on the direction of light propagation. Glass (an isotropic material) has no such dependence. In cubic crystals such as Ge, Si and GaP, however, there is such a dependence that is found to exhibit $1/\lambda^2$ variation with wavelength (Optical Anisotropy of Silicon Single Crystals, by J. Pastrnak and K. Vedam, PHYSICAL REVIEW B, VOLUME 3, NUMBER 8, Apr. 15, 1971, p. 2567–2571; COMPUTATIONAL SOLID STATE PHYSICS, by Peter Y. Yu and Manuel Cardona, Plenum Press, N.Y., edited by F. Herman, 1972; Spatial Dispersion In The Dielectric Constant of GaAs, by Peter Y. Yu and Manuel Cardona, SOLID STATE COMMUNICATIONS, VOLUME 9, NUMBER 16, Aug. 15, 1971, pp.1421–1424). The effect we are describing, spatial dispersion, is absent from the dielectric response of a cubic crystal in the limit in which the wavelength of light, $\lambda$, is much larger than the spacing between atoms. As the wavelength becomes smaller, additional terms in the dielectric response are no longer negligible. In a cubic crystal, inversion symmetry of the crystal structure only allows the first nonzero contribution to occur at order $1/\lambda^2$ and not order $1/\lambda$. There is a mathematical description of dielectric response and crystal symmetry that uses tensors and their transformations to describe how dielectric response (including spatial dispersion) can depend on the direction of light propagation. Dielectric response is described using a rank 2 tensor, denoted $\epsilon_{ij}$. The lowest order effects of spatial dispersion can be described by a rank 4 tensor, here denoted $\alpha_{ijkl}$, from the relation $$\varepsilon_{ij}(\vec{q}) = \varepsilon_{ij}(\vec{q}=0) + \sum_{kl} \alpha_{ijkl} q_k q_l.$$

Here the symbol $\vec{q}$ represents the wavevector of light; it points in the direction of light propagation and its magnitude is $$\frac{2\pi}{\lambda}.$$

The equation shows that the long-wavelength or $\vec{q}=0$ part of the dielectric tensor gets corrected by the sum of elements of the $\alpha_{ijkl}$ tensor times the x-, y-, or z-components of the wavevector. (The sum on k and l is a sum over cartesian directions x, y, and z.) This correction term represents the source of spatial dispersion. In the absence of this term, a cubic crystal would have a completely isotropic dielectric tensor $\epsilon_{ij}$ and hence no spatial dispersion. Of the possible 3×3×3×3=81 terms in the $\alpha_{ijkl}$ tensor, only 3 are nonzero and distinct in a cubic crystal with m3m symmetry, such as zincblende or fluorite structure crystals. It is known that rank 4 tensors have 3 tensor invariants. In fully isotropic systems such as glass, the tensor $\alpha_{ijkl}$ can only have 2 independent nonzero elements, and obeys the relation $$(\alpha_{1111} - \alpha_{1122})/2 - \alpha_{1212} = 0.$$

The independent nonzero elements can be taken as $\alpha_{1111}$ and $\alpha_{1122}$. In a cubic system with m3m symmetry, the relation above need not be satisfied, and there are 3 independent nonzero elements of $\alpha_{ijkl}$. These may be taken as $\alpha_{1111}$, $\alpha_{1122}$, and $\alpha_{1212}$. Since the first two tensor invariants are present in isotropic glasses, they cannot impart any anisotropy. Thus all anisotropy from spatial dispersion in cubic crystals is associated with the relation $$(\alpha_{1111} - \alpha_{1122})/2 - \alpha_{1212} \neq 0.$$

The value of this combination of tensor elements in a cubic system sets the scale for all anisotropic optical properties associated with spatial dispersion. These constants themselves depend on the wavelength of light with a variation that is typical of index dispersion, i.e. much less variation with wavelength than the explicit $1/\lambda^2$. This invention shows how to design a material in which $(\alpha_{1111} - \alpha_{1122})/2 - \alpha_{1212}$ is minimized or preferably zero at a given wavelength of design.

Pure calcium fluoride, a potential material for use in UV lithography systems, also exhibits spatial dispersion. Spatial dispersion is an inherent property of the crystal and as such cannot be reduced by processing such as annealing. Stress-induced birefringence and spatial dispersion birefringence can be distinguished by their respective wavelength dependences. The variation of spatial dispersion with wavelength is very strong compared with the variation in index of refraction or stress-induced birefringence with wavelength, with stress birefringence exhibiting roughly the dependence expected for simply the index of refraction and spatial dispersion having $1/\lambda^2$ dependence.

Birefringence, whether it is derived from stress or the spatial properties of the crystal, can have a detrimental effect on high performance optical systems. The formation of multiple images is a major concern. Phase front distortion also presents problems both in terms of imaging and metrology. Given the wavelength dependence of spatial dispersion and the bandwidth of the lasers, dispersion becomes an important issue. It is thus of importance to minimize the amount of birefringence in a material for use in high performance optical imaging systems. As was mentioned previously, stress-related birefringence can be minimized by processing (annealing) while spatial dispersion is an inherent property that must be addressed in a different manner. One approach to the problem is to prepare mixed crystals that have minimized spatial dispersion; this is a single cubic fluoride crystal that contains 2 or 3 different alkaline earth metal cations that can deliver minimized spatial dispersion. This approach recognizes that the spatial birefringence of a given crystal is largely determined by the polarizability of the cation, by analogy with the Si and Ge crystals mentioned earlier. Specifically, we utilize a change in sign of the intrinsic birefringence for $SrF_2$, $CdF_2$, or $BaF_2$ relative to $CaF_2$ based on trends in polarizability.

SUMMARY OF THE INVENTION

The invention includes a calcium strontium fluoride crystal with high VUV <200 nm transmission and low VUV <200 nm induced absorption. The $Ca_xSr_{(1-x)}F_2$ crystals of the invention preferably comprise photolithographic optical Element Blanks having a minimized amount of spatial dispersion and high performance measured <200 nm transmission and induced absorption. The first alkaline earth metal cations of strontium (Sr) have a high polarizability and the second alkaline earth metal cations of calcium (Ca) have a low polarizability. The produced mixed calcium strontium fluoride ($CaF_2+SrF_2$) crystals produced provide for VUV <200 nm photolithographic optical Element Blanks exhibiting minimized VUV <200 nm spatial dispersion and high VUV <200 nm transmission and low VUV <200 nm induced absorption. Preferably the produced mixed calcium strontium fluoride ($CaF_2+SrF_2$) VUV <200 nm photolithographic optical Element Blank crystals have minimized VUV <200 nm spatial dispersion (preferably less than 1 nm/cm at 157 nm) and a 48 mm pathlength 157 nm external transmission $\geq 75\%$ and a 60% external transmission (48 mm pathlength) cutoff wavelength $\leq 137$ nm, preferably having minimized induced absorption at 193 nm with an external transmission (16 mm pathlength)>70% after ArF excimer laser 193 nm exposure of $0.96 \times 10^6$ pulses at 17.5 $mJ/cm^2$.

The present invention includes an UV lithography method. The lithography method includes providing a radiation source with wavelength below 200-nm. The method includes providing cubic fluoride crystal optical elements having minimal spatial dispersion. The cubic fluoride crystals are comprised of a combination of alkaline earth cations having different optical polarizabilities such as to produce an overall isotropic polarizability that minimizes the fluoride crystal spatial dispersion below 200 nm. The rationale for producing the mixed crystal is based on the fact that the wavelength dependence of the dielectric tensor is expected to scale roughly with its wavelength-independent value, based on the quantum mechanical expressions for both cases. This means that more polarizable ions, with larger index of refraction, are also expected to contribute more to spatial dispersion. Some indication of this expected trend can be seen in the following table. For cubic crystal structures, the Clausius-Mossotti equation is valid, i.e., $$\frac{(n^2-1)}{(n^2+2)} = \frac{4\pi}{3}\sum N_j \alpha_j$$

where n is the refractive index, and $N_j$ is the concentration of ions of type j characterized by the electronic polarizability $\alpha_j$. A total molecular polarizability can be defined as $$\alpha = \sum V_{mol} N_j \alpha_j$$

where $V_{mol}$ is the volume per molecule. In cubic fcc crystals such as fluorite, $V_{mol}=a^3/4$ where a is the cubic lattice constant. This allows us to solve for the molecular polarizability as $$\alpha = \frac{3a^3(n^2-1)}{16\pi(n^2+2)}.$$

Given lattice constants and indices of refraction for several cubic materials, the following table can be computed:

| crystal | a (Angstroms) | index n | $\alpha$ (Angstroms$^3$) | $\Delta n \times 10^7$ |
|---|---|---|---|---|
| Si | 5.43 | 3.44 | 2.49 | +50 |
| GaAs | 5.653 | 3.4 | 8.40 | +70 |
| Ge | 5.66 | 4.00 | 9.02 | +135 |
| CaF2 | 5.463 | 1.434 | 2.534 | −11 |
| SrF2 | 5.800 | 1.438 | 3.057 | |
| BaF2 | 6.200 | 1.475 | 4.005 | |

In this table, the last column $\Delta n \times 10^7$ is the measured value of intrinsic birefringence for these materials. The clear trend among cubic semiconductors relates the magnitude of $\Delta n$ and the molecular polarizability $\alpha$. Similarly, the trend in molecular polarizability among the cubic fluorides is considered. $CaF_2$ has the lowest. The trend of $\Delta n$ with polarizability suggests that any of the other cubic fluorides will have a $\Delta n$ with a more positive value, enough to overcome the −11 value and ultimately drive to overall positive values of $\Delta n$.

Molecular polarizabilities are described in the above discussion however it is recognized that ionic polarizabilities of the cations can be used to formulate this discussion as well. All of the materials have the same ratio of cation to anion and have the same anion. A cubic crystal that incorporates an appropriate ratio of alkaline earth cations yields a material having minimized spatial dispersion.

The invention includes a fluoride crystal having a minimized amount of spatial dispersion. The fluoride combination crystal has a cubic fluoride crystal molecular structure and is comprised of a plurality of first alkaline earth metal cations and a plurality of second alkaline earth metal cations and a plurality of third alkaline earth metal cations. The first alkaline earth metal cations have a high polarizability and the second alkaline earth metal cations have a low polarizability. The appropriate combination of the first, second, and third alkaline earth metal cations in the fluoride crystal yields a crystal exhibiting minimized spatial dispersion.

DETAILED DESCRIPTION

Figure 1:
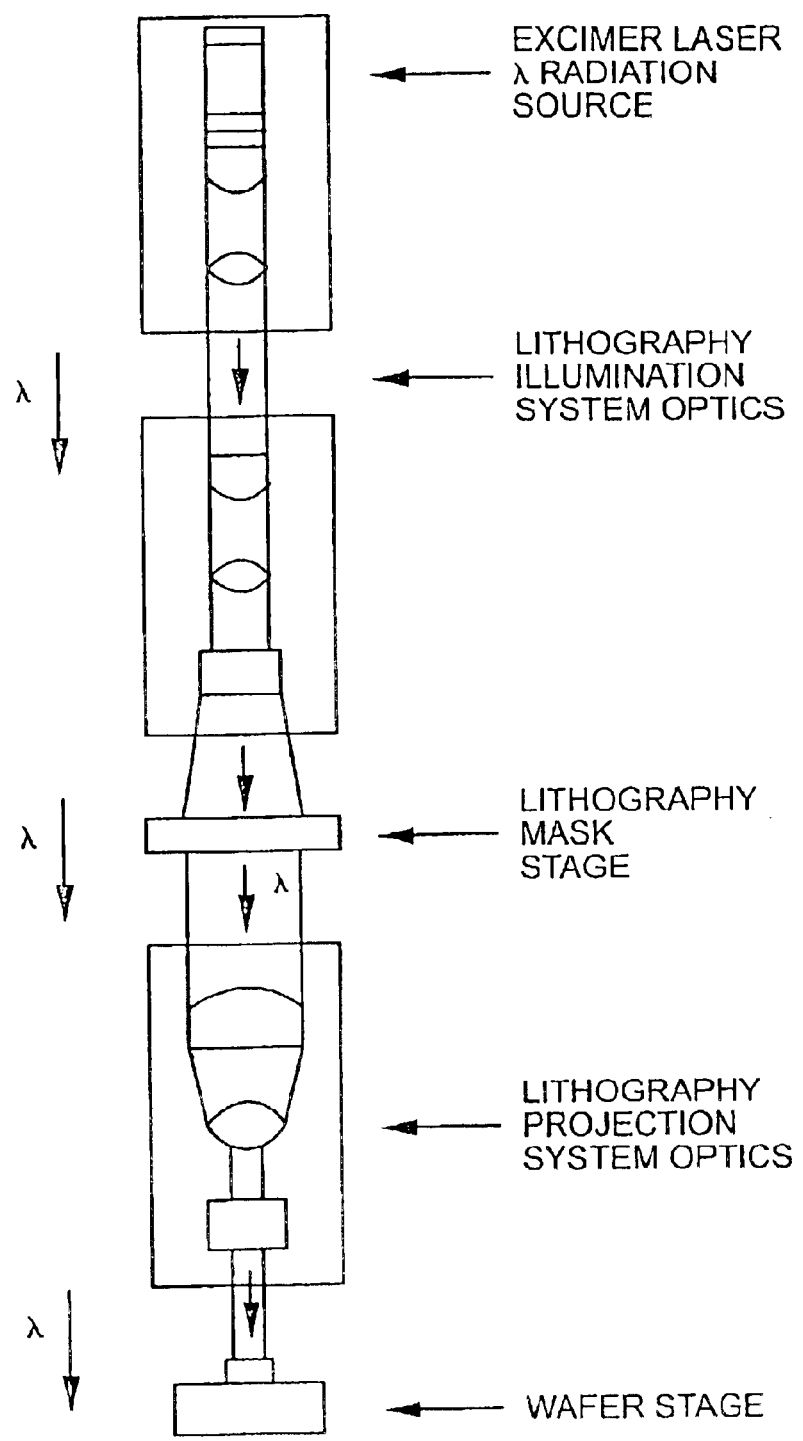
FIG. 1 shows a lithography method/system with cubic fluoride crystal optical elements E in accordance with the invention.

The invention includes a photolithographic method, such as shown in FIG. 1. The method includes providing a radiation source below 200-nm. Preferably the radiation source is an excimer laser which produces a laser emission wavelength λ of about 193 nm.

The invention includes photolithographic method, such as shown in FIG. 1. The method includes providing a radiation below 200 nm. Preferably the radiation source is an excimer laser which produces a laser emission wavelength λ of about 157 nm.

The method includes providing cubic fluoride crystal optical elements comprised of a combination of alkaline earth cations having different optical polarizabilities such as to produce an overall isotropic polarizability that minimizes the spatial dispersion below 200 nm.

Figure 2:
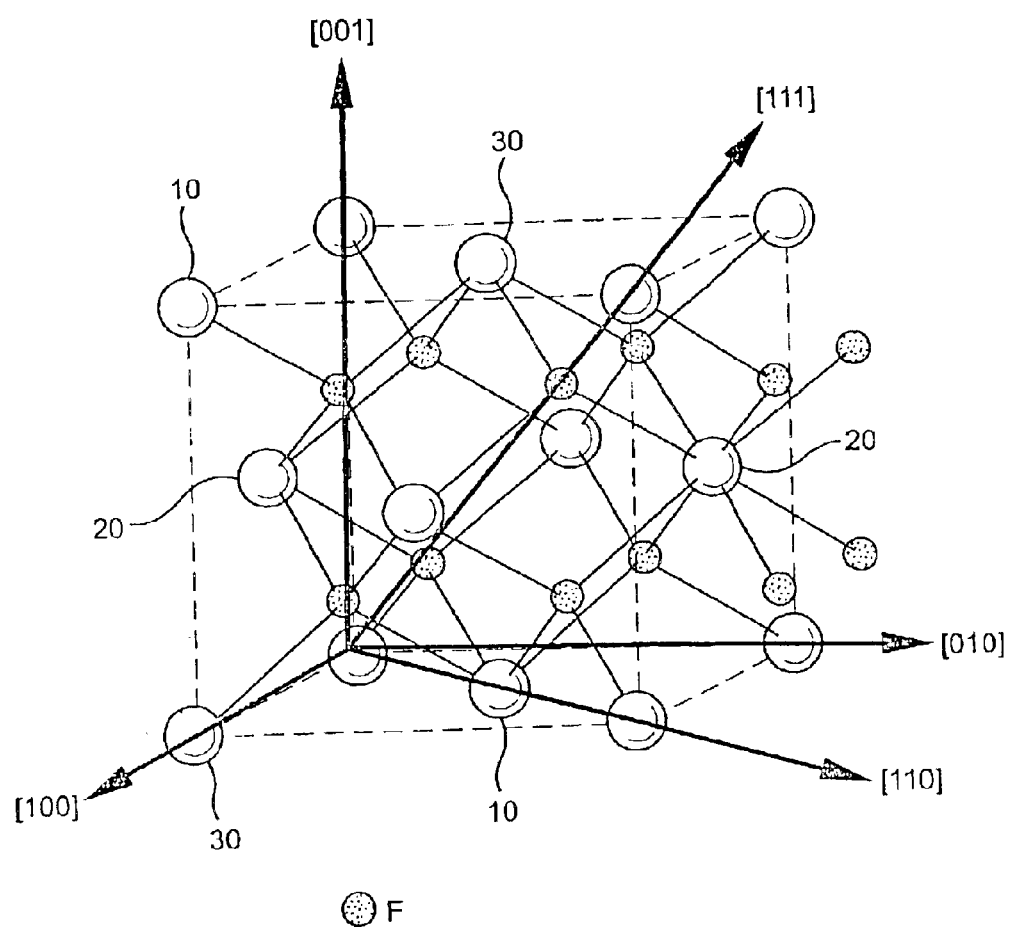
FIG. 2 shows a mixed cubic fluoride crystal in accordance with the invention.

FIG. 2 illustrates an embodiment of the cubic fluoride combination crystal of the invention with metal cations 10, 20, 30 having different optical polarizabilities. The combination of metal cations comprises a plurality of first cations 10 having a first optical polarizability combined with a plurality of second metal cations 20 having a second optical polarizability. Preferably, the combination of metal cations includes a plurality of third metal cations 30 having a third optical polarizability. The combination of different optical polarizabilities minimizes spatial dispersion in the vacuum UV wavelength range. The mixed cubic fluoride crystal preferably has an oxygen content less than 50 ppm by weight, more preferably less than 30 ppm by weight, and most preferably less than 10 ppm by weight. Preferably the low oxygen content mixed cubic fluoride crystal has a metallic contamination level less than 10 ppm by weight, more preferably less than 1 ppm by weight. Preferably the low oxygen content low metal contaminant cubic fluoride crystal has a 157 nm transmission level greater than 95%/cm, more preferably >97%/cm, and most preferred ≧99%/cm.

Figure 3:
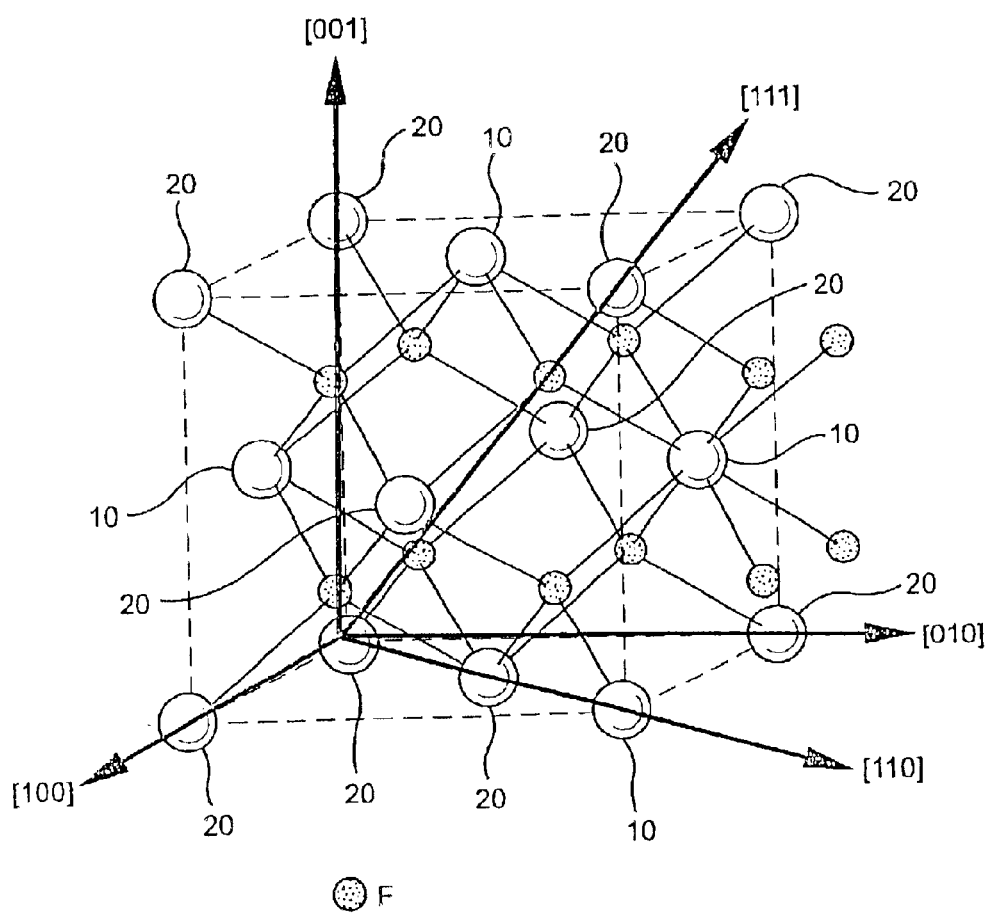
FIG. 3 shows a mixed cubic fluoride crystal in accordance with the invention.
Figure 4:
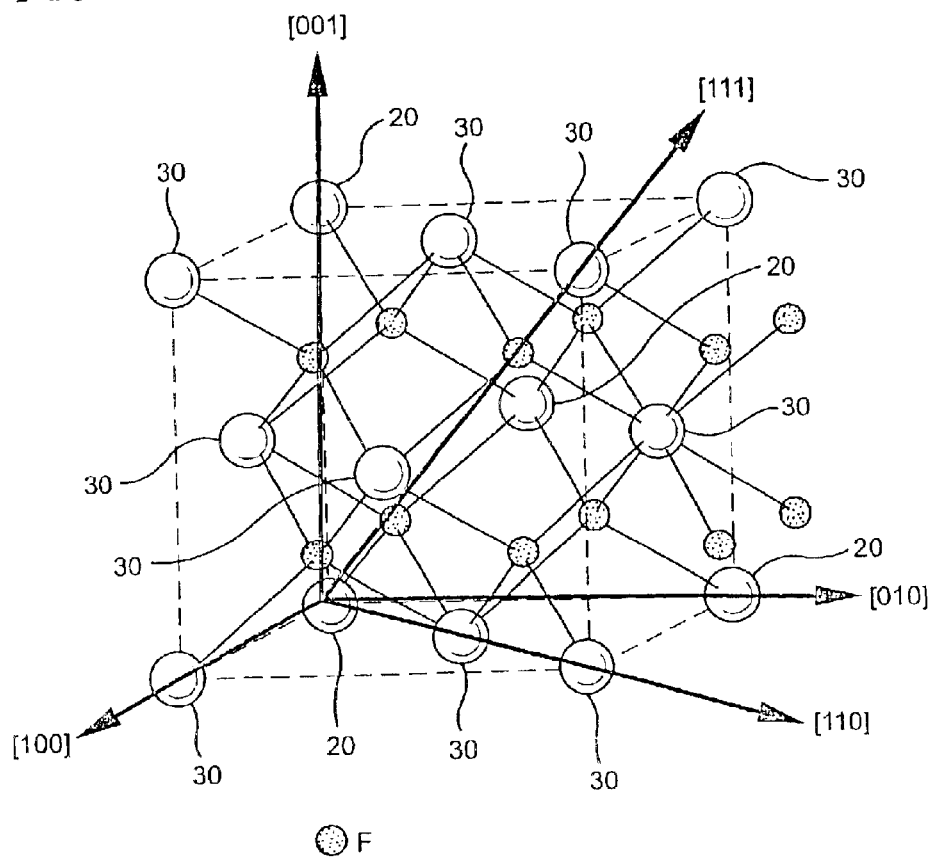
FIG. 4 shows a mixed cubic fluoride crystal in accordance with the invention.

The mixed fluoride crystal has a cubic structure such as illustrated in FIGS. 2–4. The fluoride combination crystal is comprised of a plurality of first alkaline earth metal cations and a plurality of second alkaline earth metal cations. The first alkaline earth metal cations have a high polarizability and the second alkaline earth metal cations have a low polarizability which is less than the first alkaline earth metal cation polarizability.

Preferably the second alkaline earth metal cations 20 are calcium. In a preferred embodiment the first alkaline earth metal cations are barium. In a preferred embodiment the first alkaline earth metal cations are strontium.

Preferably the mixed fluoride crystal has stress-birefringence at 633 nm less than 2 nm/cm, more preferably less than 1 nm/cm. Preferably the mixed fluoride crystal has an oxygen contamination level less than 50 ppm wt., most preferably <30 ppm wt., most preferably <10 ppm wt. Preferably the mixed fluoride crystal has a lead contamination level less than 1 ppm wt., more preferably <0.5 ppm wt. Preferably the optical fluoride crystal has a contaminating metal level less than 10 ppm wt., more preferably <5 ppm wt. Preferably the mixed fluoride crystal has an internal transmission at 157 nm of at least 95%/cm. Preferably the quantity of second alkaline earth metal cations is no less than the quantity of the first alkaline earth metal cations. Preferably the quantity of second alkaline earth metal cations is greater than the quantity of the first alkaline earth metal cations, more preferably the second metal cations quantity is no less than two times the first metal cations quantity, more preferably no less than three times, and more preferably no less than four times.

In an alternative preferred embodiment the quantity of the second alkaline earth metal cations is less than the quantity of the first alkaline earth metal cations, more preferably less than two times the quantity of the first alkaline earth metal cations, more preferably less than three times, more preferably less than four times, more preferably less than five times, more preferably less than six times, and more preferably less than seven times. Preferably the mixed fluoride crystal first metal cations high polarizability is greater than 0.5 Pauling polarizability cubic angstrom units and the second alkaline earth metal cations low polarizability is less than 0.5 Pauling polarizability cubic angstrom units. Preferably the second alkaline earth metal cations have a low polarizability less than 0.8 Pauling polarizability cubic angstrom units. Preferably the first alkaline earth metal cations have a high polarizability which is greater than 0.8 Pauling polarizability cubic angstrom units. Preferably the mixed fluoride crystal first alkaline earth metal cation has a crystal ionic radius in a greater than 1.05 and the second alkaline earth metal cation has a crystal ionic radius in a less than 1.05.

Preferably the mixed fluoride crystal first metal cations high polarizability is greater than 2.9 (Angstroms³) α molecular polarizability and the second alkaline earth metal cations low polarizability is less than 2.9 (Angstroms$^3$) α molecular polarizability. Preferably the second alkaline earth metal cations have a low polarizability less than about 2.6 (Angstroms$^3$) α molecular polarizability. Preferably the first alkaline earth metal cations have a high polarizability which is greater than about 3 (Angstroms$^3$) α molecular polarizability. Preferably the mixed fluoride crystal first alkaline earth metal cation has a cubic lattice constant a>5.6 (Angstroms) and the second alkaline earth metal cation has a cubic lattice constant a<5.6 (Angstroms).

As shown in FIG. 2, in an embodiment the mixed fluoride crystal is a combination of three metal cations including third metal cations having a third polarizability. Preferably the first metal cations high polarizability is greater than 1 Pauling polarizability cubic angstrom units and the second alkaline earth metal cations low polarizability is less than 0.5 Pauling polarizability cubic angstrom units and the third alkaline earth metal cations polarizability is between 0.5 and 1 Pauling polarizability cubic angstrom units. Preferably the mixed fluoride crystal first metal cations high polarizability is greater than 3.9 (Angstroms$^3$) α molecular polarizability and the second alkaline earth metal cations low polarizability is less than 2.6 (Angstroms$^3$) α molecular polarizability, and the third alkaline earth metal cation polarizability is between 2.6 and 3.9(Angstroms$^3$) α molecular polarizability. Preferably the mixed fluoride crystal first alkaline earth metal cation has a cubic lattice constant a>6 (Angstroms)and the second alkaline earth metal cation has a cubic lattice constant a<5.5 (Angstroms) and the third alkaline earth metal cation has a cubic lattice constant a between 5.5 and 6 (Angstroms).

The invention includes a mixed fluoride crystal that exhibits minimal spatial dispersion. The mixed crystal has a cubic structure with a plurality of first alkaline earth metal cations, a plurality of second alkaline earth metal cations and a plurality of third alkaline earth metal cations. The first alkaline earth metal cations have a high polarizability and the second alkaline earth metal cations have a low polarizability and the third alkaline earth metal cations having an intermediate polarizability. The first and third alkaline earth metal cations provide the ability to impart positive spatial dispersion at short wavelengths while the second alkaline earth metal cations provides negative spatial dispersion. Preferably the first alkaline earth metal cations high polarizability is greater than 1 Pauling polarizability cubic angstrom units, the second alkaline earth metal cations low polarizability is less than 0.5 Pauling polarizability cubic angstrom units and the third alkaline earth metal cations intermediate polarizability is between 0.5 and 1 Pauling polarizability cubic angstrom units. Preferably the crystal has a stress-birefringence at 633 nm less than 5 nm/cm, an oxygen contamination level <50 ppm. wt. and an internal transmission at 157 nm of at least 95%/cm. Preferably the crystal first alkaline earth metal cation has a crystal ionic radius in A greater than 1.25 and the second alkaline earth metal cation has a crystal ionic radius in A less than 1.05 and the third alkaline earth metal cation has a crystal ionic radius in A between 1.05 and 1.25

Figure 5:
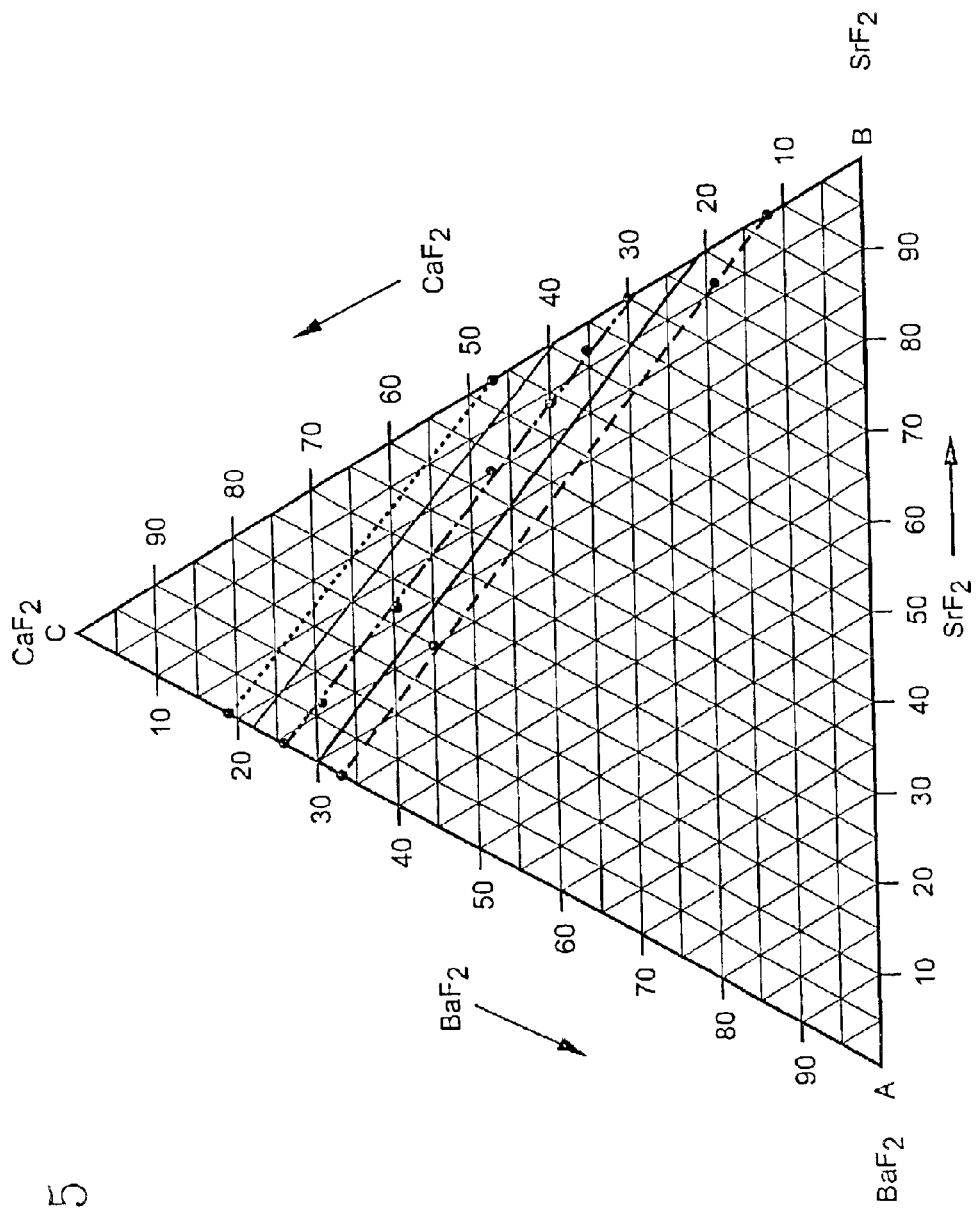
FIG. 5 shows a molar ratio chart of mixed cubic fluoride crystals in accordance with the invention.

FIG. 2 illustrates embodiments of the invention where the mixed crystal is a combination of three different alkaline earth metal cations 10, 20, and 30. The molar ratio chart of FIG. 5 shows the preferred compositions of the three different alkaline earth metal cations with the low polarizability cation being Ca, the high polarizability cation being Ba, and the intermediate polarizability cation being Sr. Table 1 discloses CaF$_2$+BaF$_2$+SrF$_2$ mixed crystal weight percent examples A1–A5 in accordance with the invention. The alkaline earth combination crystal weight percent ranges of CaF$_2$ (low polarizability)+BaF$_2$ (high polarizability)+SrF$_2$ (intermediate polarizability) are 6 to 35 wt. % CaF$_2$, 29 to 45 wt. % BaF$_2$, and 37 to 49 wt. % SrF$_2$; particularly preferred 6.8–32.6 wt. % CaF$_2$, 29.6–44.7 wt. % BaF$_2$, and 37.9–48.5 wt. % SrF$_2$. More preferred ranges are 12 to 26 wt. % CaF$_2$, 32 to 41 wt. % BaF$_2$, and 41 to 48 wt. % SrF$_2$; particularly, more preferred 12.6–25.8 wt. % CaF$_2$, 32.7–40.3 wt. % BaF$_2$, and 41.5–47.2 wt. % SrF$_2$. Most preferred ranges are 17 to 21 wt. % CaF$_2$, 33 to 38 wt. % BaF$_2$, and 43 to 47 wt. % SrF$_2$; particularly most preferred 18.9±2 wt. % CaF$_2$, 35.4±2 wt. % BaF$_2$, and 45.67±2 wt. % SrF$_2$. Particularly most preferred the three cation combination crystal is 18.9±wt. % CaF$_2$, 35.4±wt. % BaF$_2$, and 45.67±1 wt. % SrF$_2$.

TABLE 1

| CaF$_2$ + BaF$_2$ + SrF$_2$ Mixed Crystal Wt. % | | | | | |
|---|---|---|---|---|---|
| | A1 | A2 | A3 | A4 | A5 |
| CaF$_2$ | 32.56 | 18.92 | 6.82 | 12.56 | 25.80 |
| BaF$_2$ | 29.55 | 35.41 | 44.69 | 40.29 | 32.69 |
| SrF$_2$ | 37.89 | 45.67 | 48.49 | 47.15 | 41.51 |

| Alkaline Earth Combination Crystal Wt. % Ranges of CaF$_2$ + BaF$_2$ + SrF$_2$ | | | |
|---|---|---|---|
| | Preferred | More Preferred | Most Preferred |
| CaF$_2$ | 6 to 35 wt. % (6.8 to 32.6) | 12 to 26 wt. % (12.6 to 25.8) | 17 to 21 wt. % (18.9 ± 2; ± 1) |
| BaF$_2$ | 29 to 45 wt. % (29.6 to 44.7) | 32 to 41 wt. % (32.7 to 40.3) | 33 to 38 wt. % (35.4 ± 2; ± 1) |
| SrF$_2$ | 37 to 49 wt. % (37.9 to 48.5) | 41 to 48 wt. % (41.5 to 47.2) | 43 to 47 wt. % (45.67 ± 2; ± 1) |

FIG. 3 illustrates embodiments of the invention where the mixed crystal is a combination of two different alkaline earth metal cations 10 and 20. The high polarizability cation is Ba and the low polarizability cation is Ca. Table 2 discloses CaF$_2$+BaF$_2$ mixed crystal weight percent examples B1–B5 in accordance with the invention. The alkaline earth combination crystal weight percent ranges of CaF$_2$ (low polarizability)+BaF$_2$ (high polarizability) are 47 to 66 wt. % CaF$_2$ and 34 to 53 wt. % BaF$_2$; particularly preferred 47.5–65.5 wt. % CaF$_2$ and 34.5–52.5 wt. % BaF$_2$. More preferred ranges are 51 to 63 wt. % CaF$_2$ and 38 to 49 wt. % BaF$_2$; particularly more preferred 51–61.2 wt. % CaF$_2$ and 38.8–49 wt. % BaF$_2$. Most preferred ranges are 55 to 59 wt. % CaF$_2$ and 40 to 45 wt. % BaF$_2$; particularly 57.2±2 wt. % CaF$_2$ and 42.8±2 wt. % BaF$_2$. Particularly most preferred is 57.2±1 wt. % CaF$_2$ and 42.8±1 wt. % BaF$_2$.

TABLE 2

| CaF$_2$ + BaF$_2$ Mixed Crystal Wt. % | | | |
|---|---|---|---|
| | | Mole % | Weight % |
| B1 | CaF$_2$ | 81 | 65.5 |
|  | BaF$_2$ | 19 | 34.5 |
| B2 | CaF$_2$ | 67 | 47.5 |
|  | BaF$_2$ | 33 | 52.5 |
| B3 | CaF$_2$ | 75 | 57.2 |
|  | BaF$_2$ | 25 | 42.8 |
| B4 | CaF$_2$ | 78 | 61.2 |
|  | BaF$_2$ | 22 | 38.8 |

TABLE 2-continued

| B5 | CaF$_2$ | 70 | 51 |
| | BaF$_2$ | 30 | 49 |

Alkaline Earth Combination Crystal Wt. % Ranges of CaF$_2$ + BaF$_2$

| | Preferred | More Preferred | Most Preferred |
| --- | --- | --- | --- |
| CaF$_2$ | 47 to 66 wt. % (47.5 to 65.5) | 51 to 63 wt. % (51 to 61.2) | 55 to 59% (57.2) |
| BaF$_2$ | 34 to 53 wt. % (34.5 to 52.5) | 38 to 49 wt. % (38.8 to 49) | 40 to 45% (42.8) |

FIG. 4 illustrates embodiments of the invention where the mixed crystal is a combination of two different alkaline earth metal cations 20 and 30. The high polarizability cation is Sr and the low polarizability cation is Ca. Table 3 discloses CaF$_2$+SrF$_2$ mixed crystal weight percent examples C1–C5 in accordance with the invention. The alkaline earth combination crystal weight percent ranges of CaF$_2$ (low polarizability)+SrF$_2$ (high polarizability) are 7 to 36 wt. % CaF$_2$ and 64 to 93 wt. % SrF$_2$; particularly preferred 7.8–35.5 wt. % CaF$_2$ and 64.5–92.2 wt. % SrF$_2$. More preferred ranges are 14 to 29 wt. % CaF$_2$ and 71 to 86 wt. % SrF$_2$; particularly preferred 14.2–28.4 wt. % CaF$_2$ and 71.6–85.8 wt. % SrF$_2$. Most preferred ranges are 18 to 24 wt. % CaF$_2$ and 76 to 82 wt. % SrF$_2$; particularly 21±2 wt. % CaF$_2$ and 79±2 wt. % SrF$_2$.

TABLE 3

CaF$_2$ + SrF$_2$ Mixed Crystal Wt. %

| | | Mole % | Weight % |
| --- | --- | --- | --- |
| C1 | CaF$_2$ | 12 | 7.8 |
| | SrF$_2$ | 88 | 92.2 |
| C2 | CaF$_2$ | 47 | 35.5 |
| | SrF$_2$ | 53 | 64.5 |
| C3 | CaF$_2$ | 30 | 21 |
| | SrF$_2$ | 70 | 79 |
| C4 | CaF$_2$ | 21 | 14.2 |
| | SrF$_2$ | 79 | 85.8 |
| C5 | CaF$_2$ | 39 | 28.4 |
| | SrF$_2$ | 61 | 71.6 |

Alkaline Earth Combination Crystal Wt. % Ranges of CaF$_2$ + SrF$_2$

| | Preferred | More Preferred | Most Preferred |
| --- | --- | --- | --- |
| CaF$_2$ | 7 to 36 wt. % (7.8 to 35.5) | 14 to 29 wt. % (14.2 to 28.4) | 18 to 24%; 20 to 22% (21) |
| SrF$_2$ | 64 to 93 wt. % (64.5 to 92.2) | 71 to 86 wt. % (71.6 to 85.8) | 76 to 82%; 78 to 80% (79) |

The invention includes a calcium strontium fluoride crystal with high VUV <200 nm transmission and low VUV <200 nm induced absorption. The Ca$_x$Sr$_{(1-x)}$F$_2$ crystals of the invention preferably comprise photolithographic optical Element Blanks having a minimized amount of spatial dispersion and high performance measured <200 nm transmission and induced absorption. The first alkaline earth metal cations of strontium (Sr) have a high polarizability and the second alkaline earth metal cations of calcium (Ca) have a low polarizability. The produced mixed calcium strontium fluoride (CaF$_2$+SrF$_2$) crystals produced provide for VUV <200 nm photolithographic optical Element Blanks exhibiting minimized VUV <200 nm spatial dispersion and high VUV <200 nm transmission and low VUV <200 nm induced absorption. Preferably the produced mixed calcium strontium fluoride (CaF$_2$+SrF$_2$) VUV <200 nm photolithographic optical Element Blank crystals have minimized VUV <200 nm spatial dispersion and a 48 mm pathlength 157 nm external transmission ≧75% and a 60% external transmission (48 mm pathlength) cutoff wavelength ≦137 nm, preferably having minimized induced absorption at 193 nm with an external transmission (16 mm pathlength)>70% after ArF excimer laser 193 nm exposure of 0.96×10$^6$ pulses at 17.5 mJ/cm$^2$. The fluoride crystals do not have to have a pathlength of 48 mm or 16 mm. The crystals are of such quality and optical performance that if the crystal of the invention is made to have a pathlength of 48 mm and/or 16 mm that the crystal will have such an external transmission when measured. The optical properties of the inventions crystals are such that if a bulk crystal is made to have such a path length then the measured external transmission with optical quality surfaces will have external transmission levels in accordance with the invention. In accordance with the invention mixed crystals of the form R$_{(1-x)}$R'$_x$F$_2$ where R and R' are either Ca, Ba or Sr and x is chosen to yield a material with zero intrinsic birefringence. In a preferred embodiment the mixed fluoride crystal is a Ca/Sr mixed crystal. A set of Ca/Sr crystal mixtures were grown to yield a variety of mixed Ca and Sr fluoride crystals from which 20–30 mm prism could be fabricated. Calcium, Barium and Strontium fluoride all have the same fluorite structure (space group Fm3m) and mixed crystals retain the cubic symmetry. Intrinsic birefringence should vary approximately linearly with x between the values of the pure crystals. To null out the intrinsic birefringence in mixed crystals: X=IΔn(CaF$_2$)/[Δn(CaF$_2$)–Δn(MF$_2$)], M=Ba, Sr (For 193.4 nm: Ca$_{0.85}$Ba$_{0.15}$F$_2$, Ca$_{0.79}$Sr$_{0.21}$F$_2$), (For 157.6 nm: Ca$_{0.75}$Ba$_{0.25}$F$_2$, Ca$_{0.52}$Sr$_{0.48}$F$_2$). Ca$_x$Sr$_{(1-x)}$F$_2$ Mixtures with x varying from 0.1 to 0.9 were grown in a vacuum Stockbarger furnace. Mixtures of SrF$_2$ and CaF$_2$ feedstocks for the crucibles were made to keep the length of crystal constant. Crystal rod ingots of 52 mm diameter by 130 mm long of the mixed form Ca$_x$Sr$_{(1-x)}$F$_2$ with x Varying from 0.1 to 0.9 were successfully grown with high transmission and low scatter.

TABLE 4

Mixed Crystal Ca$_x$Sr$_{(1-x)}$F$_2$ SAMPLE INGOTS

Ca$_x$Sr$_{(1-x)}$F$_2$ Calculations

| X | CaF2 g | SrF2 g | Calc. Density of mix g/cc | Wt. of 280 cc g |
| --- | --- | --- | --- | --- |
| 0.1 | 7.80 | 191.9 | 4.168 | 1156 |
| 0.2 | 15.6 | 170.6 | 4.000 | 1120 |
| 0.3 | 23.4 | 149.2 | 3.950 | 1106 |
| 0.4 | 31.2 | 127.9 | 3.840 | 1075 |
| 0.5 | 39.0 | 106.6 | 3.730 | 1044 |
| 0.6 | 46.8 | 85.3 | 3.622 | 1014 |
| 0.7 | 54.6 | 64.0 | 3.504 | 981 |
| 0.8 | 62.4 | 42.6 | 3.400 | 952 |
| 0.9 | 70.2 | 21.3 | 3.290 | 921 |

Ca$_x$Sr$_{(1-x)}$F$_2$: Mixes per Crucible for each x

| | | | | PbF2 g | |
| X | CaF2 g | SrF2 g | 0.5% | 1.0% | 2.0% |
| --- | --- | --- | --- | --- | --- |
| 0.1 | 45 | 1111 | 6 | 11 | 23 |
| 0.2 | 94 | 1026 | 6 | 11 | 22 |
| 0.3 | 150 | 956 | 6 | 11 | 22 |
| 0.4 | 211 | 864 | 5 | 11 | 21 |
| 0.5 | 280 | 764 | 5 | 10 | 21 |
| 0.6 | 359 | 655 | 5 | 10 | 20 |
| 0.7 | 452 | 529 | 5 | 10 | 20 |
| 0.8 | 594 | 358 | 5 | 10 | 19 |
| 0.9 | 707 | 214 | 5 | 9 | 18 |

Figure 6:
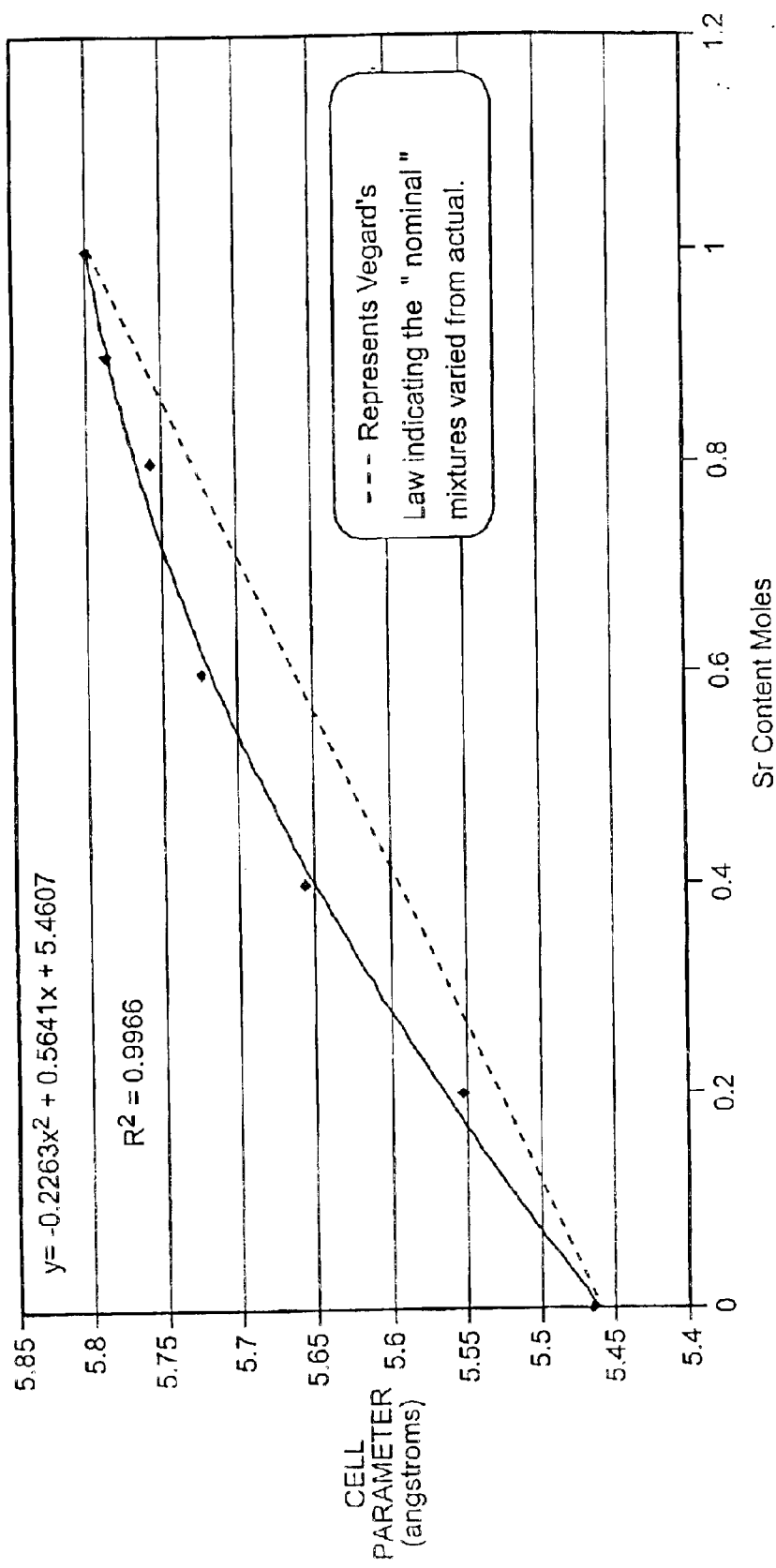
FIG. 6 is a plot of x-ray measurements of lattice constants of $Ca_xSr_{(1-x)}F_2$ crystal samples with Cell Parameter (angstoms) versus Sr content in moles.
Figure 7:
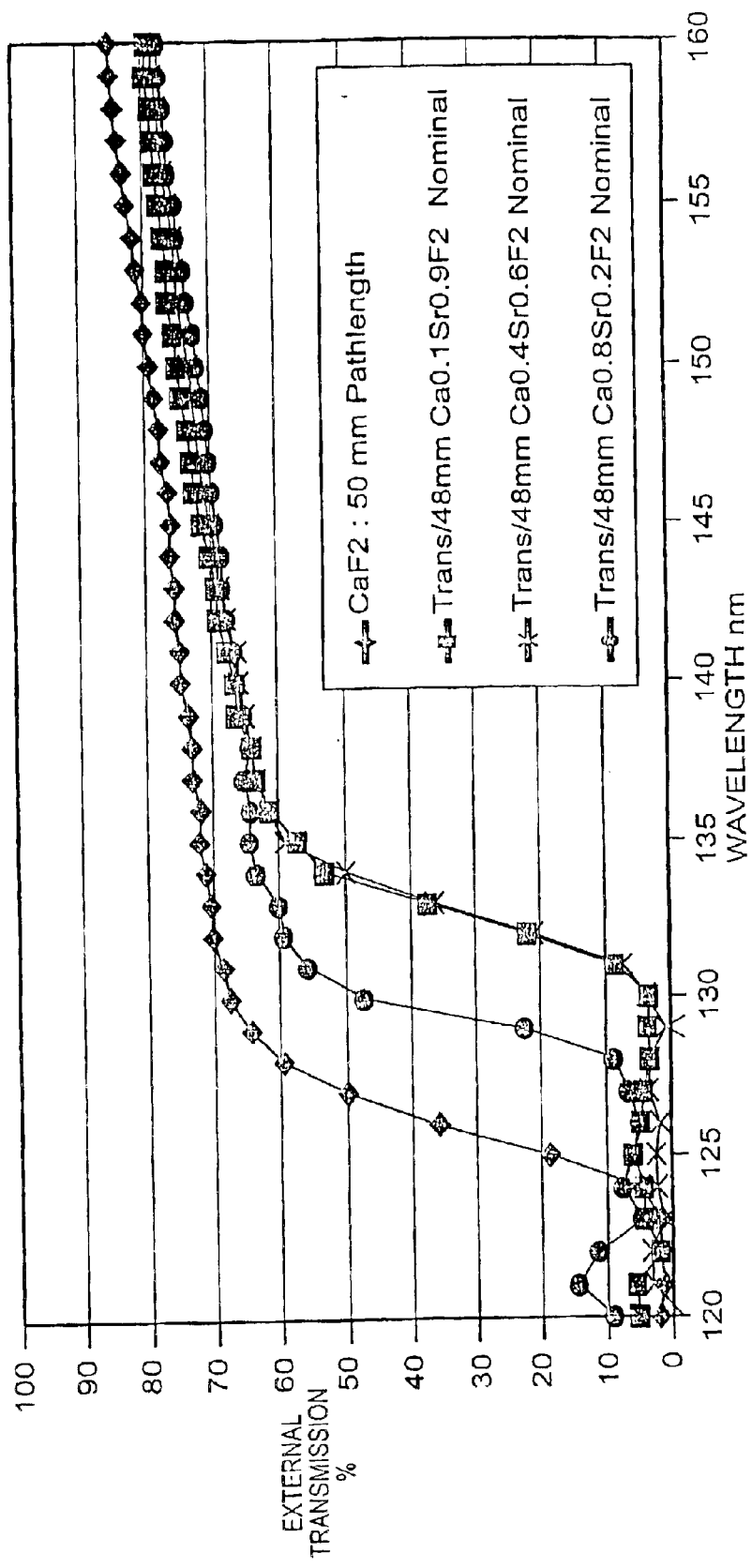
FIG. 7 are the measured VUV external transmission spectra of $Ca_xSr_{(1-x)}F_2$ crystal samples.
Figure 8:
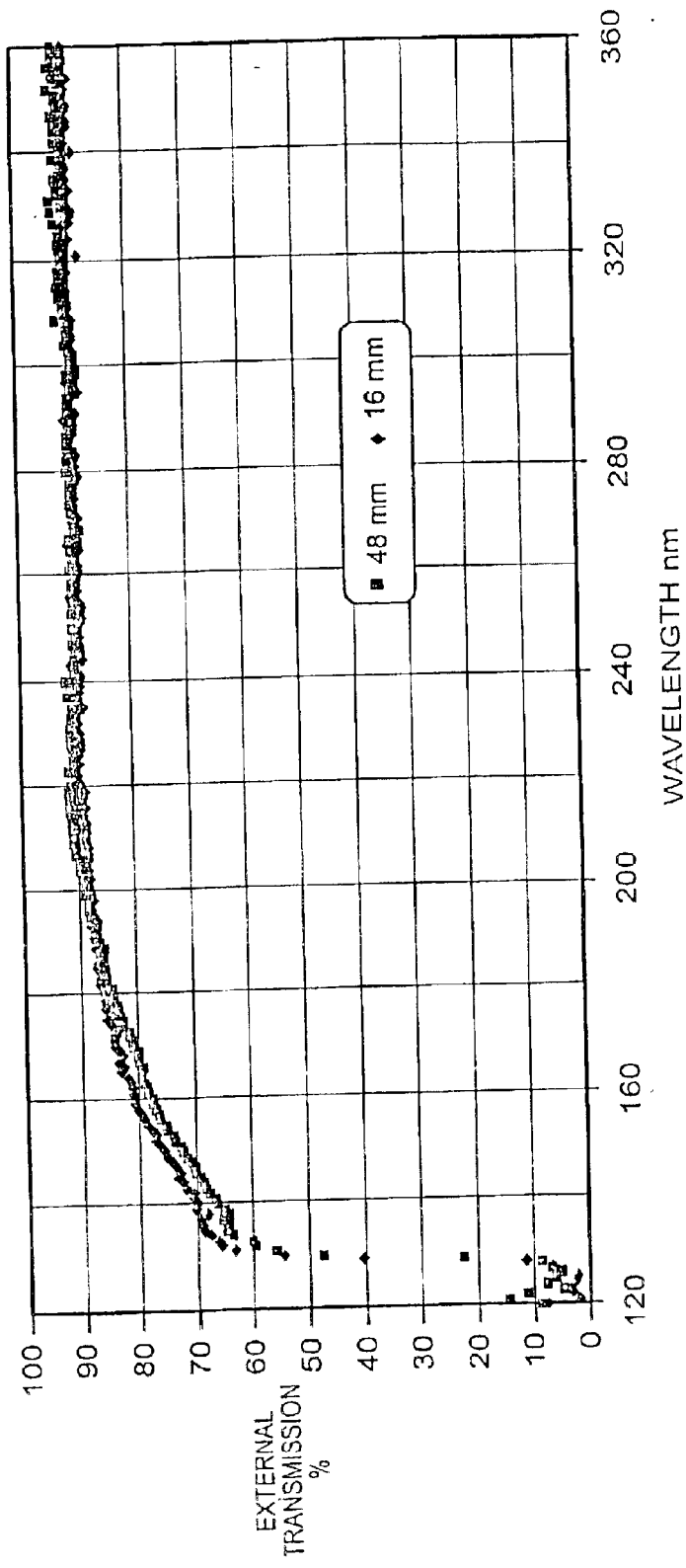
FIG. 8 shows the VUV external transmission of $Ca_{0.8}Sr_{0.2}F_2$ sample disk pathlengths of 48 mm and 16 mm.
Figure 9:
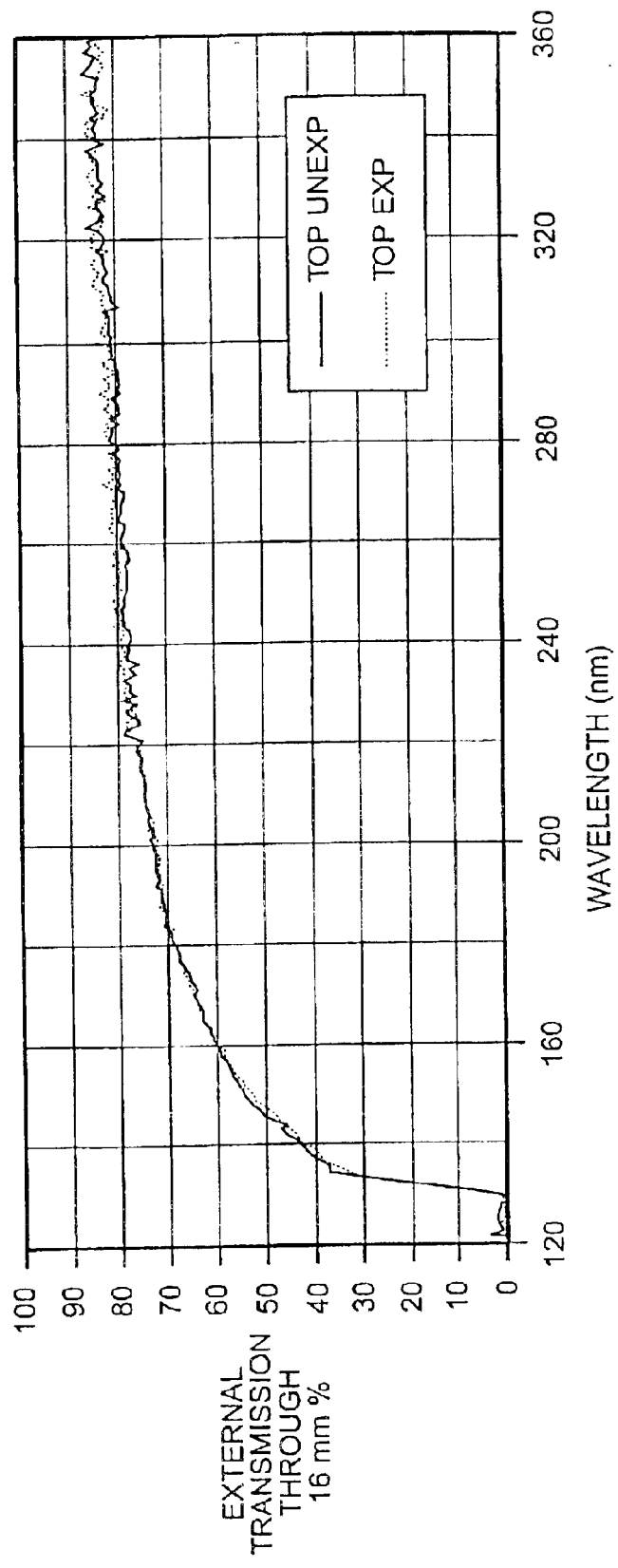
FIG. 9 shows the induced absorption laser damage resistence of a $Ca_{0.2}Sr_{0.8}F_2$ sample disk with VUV external transmission through a 16 mm pathlength before (Unexp) and after (Exp) exposure to $0.96 \times 10^6$ pulses at 17.5 mJ/cm² of an ArF (193 nm) excimer laser.
Figure 10:
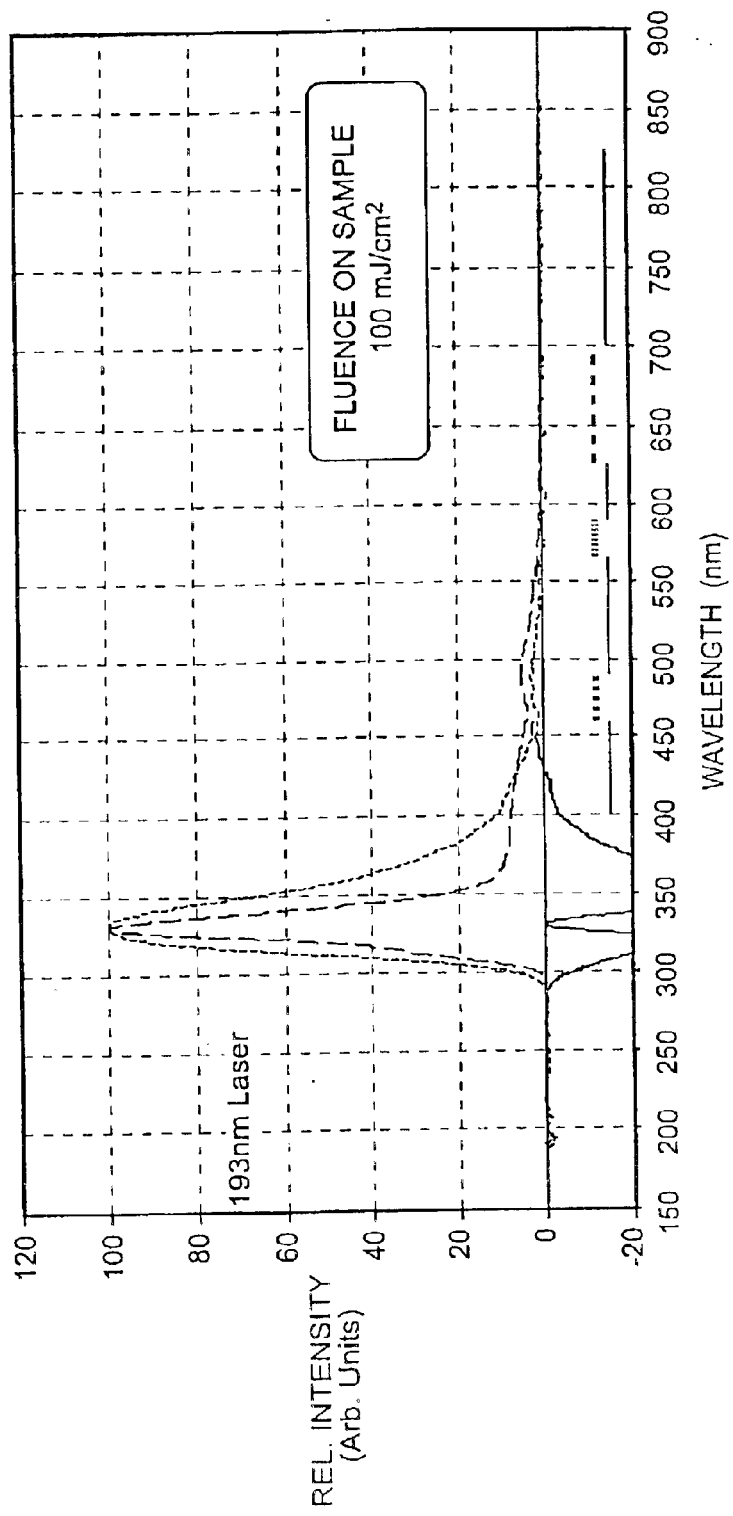
FIG. 10 shows the 193 nm laser induced fluorescence spectrum of a $Ca_{0.2}Sr_{0.8}F_2$ sample with the excited fluorescence spectrums induced by a fluence of 100 mJ/cm² on the sample.

PbF$_2$ was used as a fluorinating agent during the making of the crystal and was included in the crucibles. Crystals grown were single and free of gross imperfections such as cracks, bubbles etc (any visible scattering centers were restricted to the very tops of crystal ingots). Oriented test prisms of 20–30 mm side were made from the grown Calcium Strontium mixture crystal ingot rods. From the grown Calcium Strontium mixture crystal ingots sample disks were cut using diamond tooling and aqueous coolant with no fractures occuring during such machining. The sample disks were polished and plasma cleaned prior to optical measurements in a spectrometer and spectrophotometer. The calcium strontium mixed fluoride crystal sample disks were 16 mm thick, 52 mm round with two flats polished to give 48 mm pathlengths. X-ray Measurements (FIG. 6) indicate that the actual grown crystal mix varies from the nominal mix in the crucible. FIG. 7 shows the VUV external transmission of the $Ca_xSr_{(1-x)}F_2$ sample disks with x=0.1, 0.4, 0.8. FIG. 8 shows the VUV external transmission of a $Ca_{0.8}Sr_{0.2}F_2$ sample disk pathlengths of 48 mm and 16 mm. FIG. 9 shows the induced absorption laser damage resistence in a $Ca_{0.2}Sr_{0.8}F_2$ sample disk (external transmission through 16 mm pathlength) before (Unexp) and after (Exp) exposure to $0.96\times10^6$ pulses at 17.5 $mJ/cm^2$ of an ArF (193 nm) excimer laser. FIG. 10 shows the 193 nm laser induced fluorescence spectrum of a $Ca_{0.2}Sr_{0.8}F_2$ sample with the excited fluorescence spectrums induced by a fluence of 100 $mJ/cm^2$ on the sample.

The invention includes a method of making a mixed fluoride crystal optical element blank for less than 200 nm wavelength optics. The method including providing a calcium strontium fluoride crystal feedstock mixture of $Ca_{x\ nominal}Sr_{(1-x\ nominal)}F_2$ with x nominal in the range from 0.1 to 0.9. The method includes providing a mixed calcium strontium fluoride oriented crystal seed of $Ca_xSr_{(1-x)}F_2$ with x in the range from 0.1 to 0.9. The method includes providing a calcium strontium fluoride crystal growth crucible having a mixed crystal growth chamber and a mixed calcium strontium seed crystal orientation receiver for receiving and orienting a mixed calcium strontium seed crystal in relation to said crystal growth chamber. The method includes loading the mixed calcium strontium fluoride oriented crystal seed into the seed crystal receiver and loading the calcium strontium fluoride crystal feedstock mixture into said calcium strontium fluoride crystal growth crucible. The method includes melting said calcium strontium fluoride crystal feedstock mixture and an upper portion of said mixed calcium strontium fluoride oriented crystal seed. The method includes progressively moving said mixed calcium strontium fluoride oriented crystal seed, said melted upper portion of said mixed calcium strontium fluoride oriented crystal seed, and said melted calcium strontium fluoride crystal feedstock mixture through a crystal growth temperature gradient to grow a seeded oriented calcium strontium fluoride crystal of $Ca_xSr_{(1-x)}F_2$ with x in the range from 0.1 to 0.9. In an embodiment the mixed calcium strontium fluoride oriented crystal seed is a 100 oriented optical fluoride seed crystal. In an embodiment the mixed calcium strontium fluoride oriented crystal seed is a 110 oriented optical fluoride seed crystal. In an embodiment the mixed calcium strontium fluoride oriented crystal seed is a 111 oriented optical fluoride seed crystal.

Figure 11:
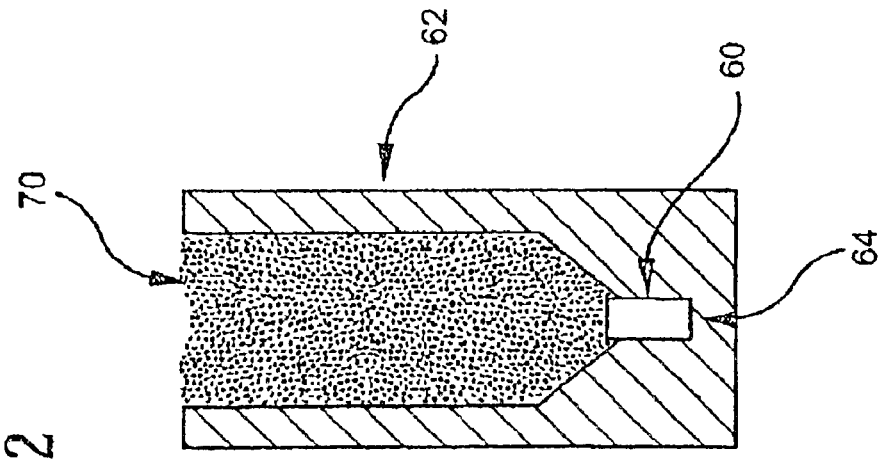
FIG. 11 shows an embodiment of the invention.
Figure 12:
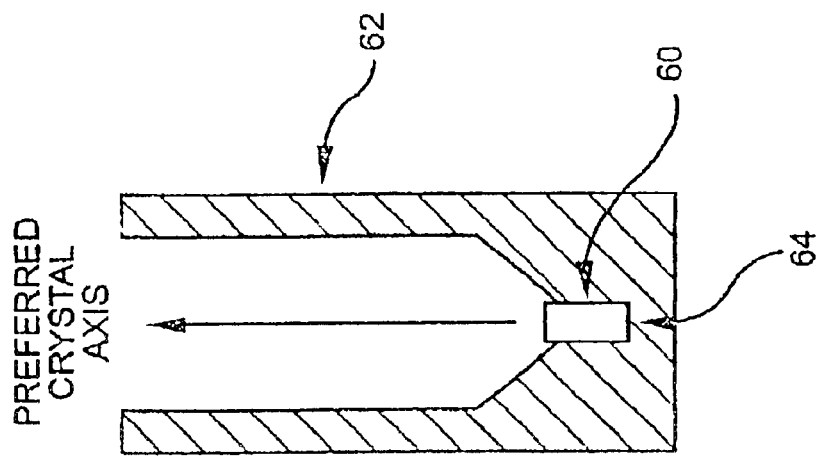
FIG. 12 shows an embodiment of the invention.
Figure 13:
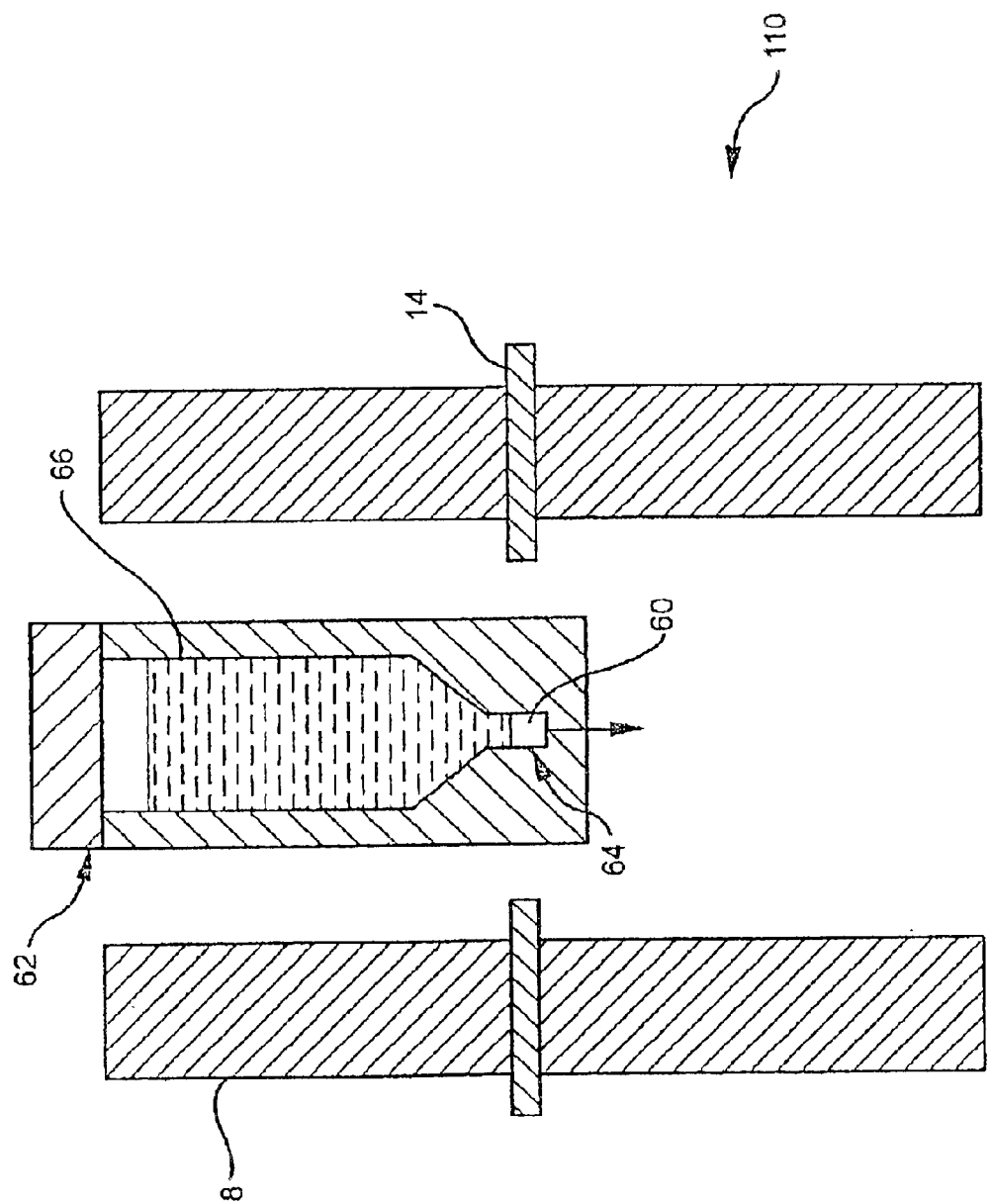
FIG. 13 shows an embodiment of the invention.
Figure 14:
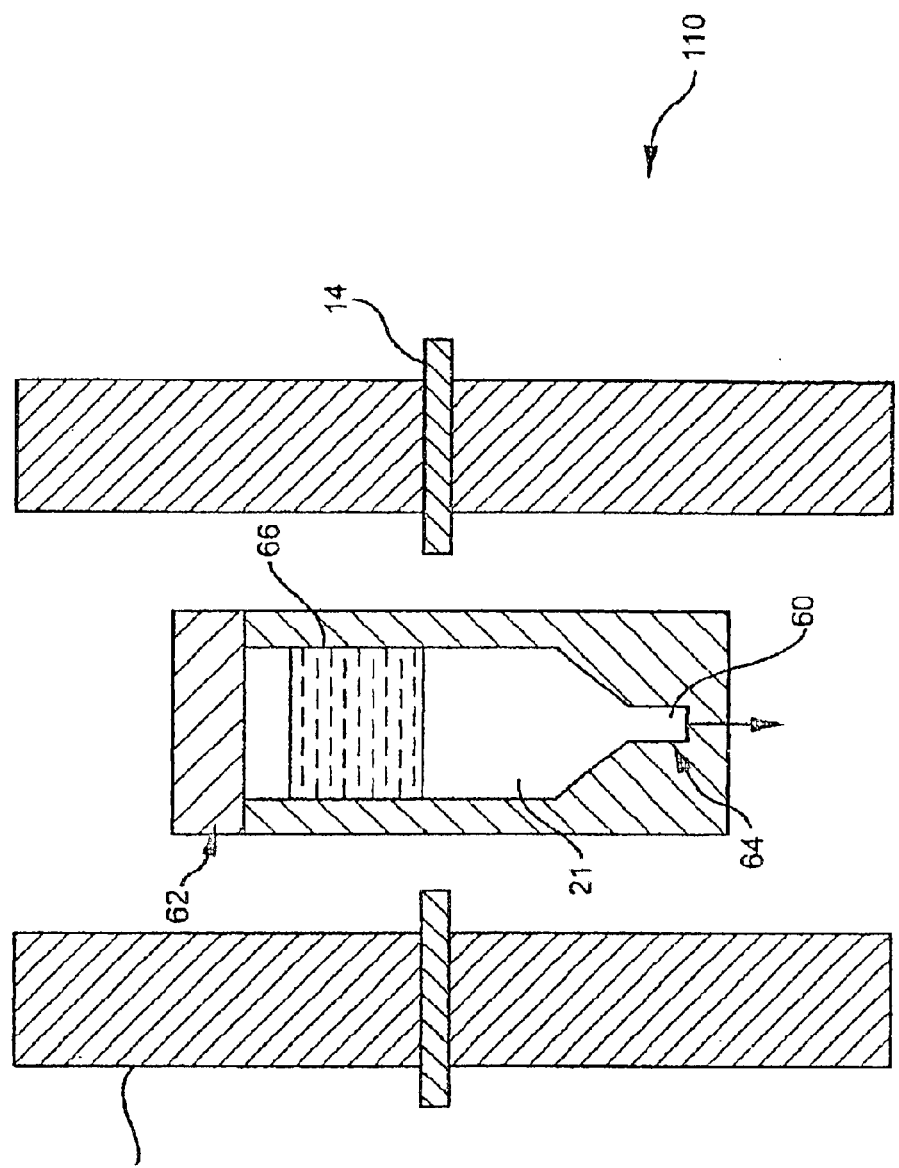
FIG. 14 shows an embodiment of the invention.
Figure 15:
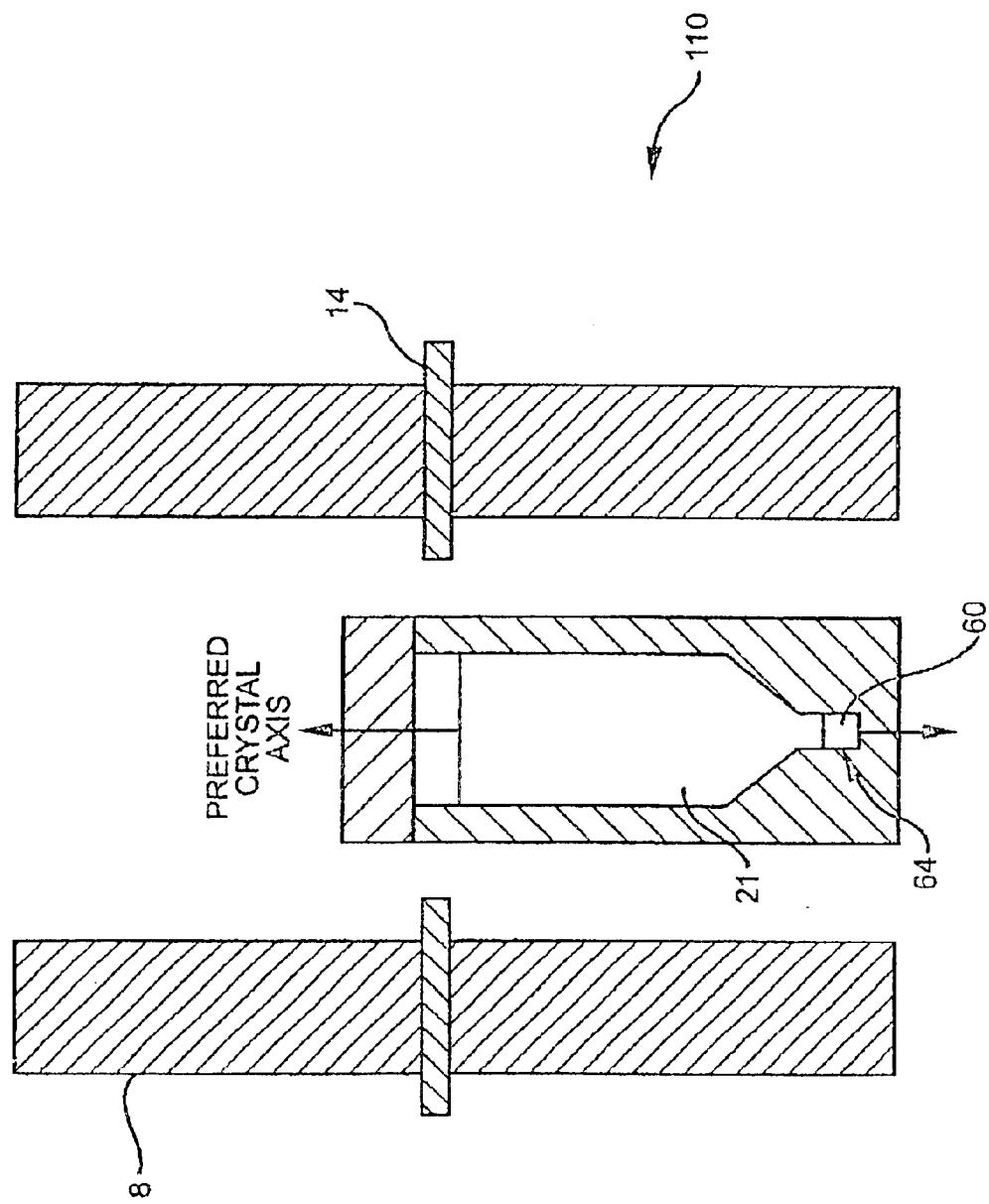
FIG. 15 shows an embodiment of the invention.
Figure 16:
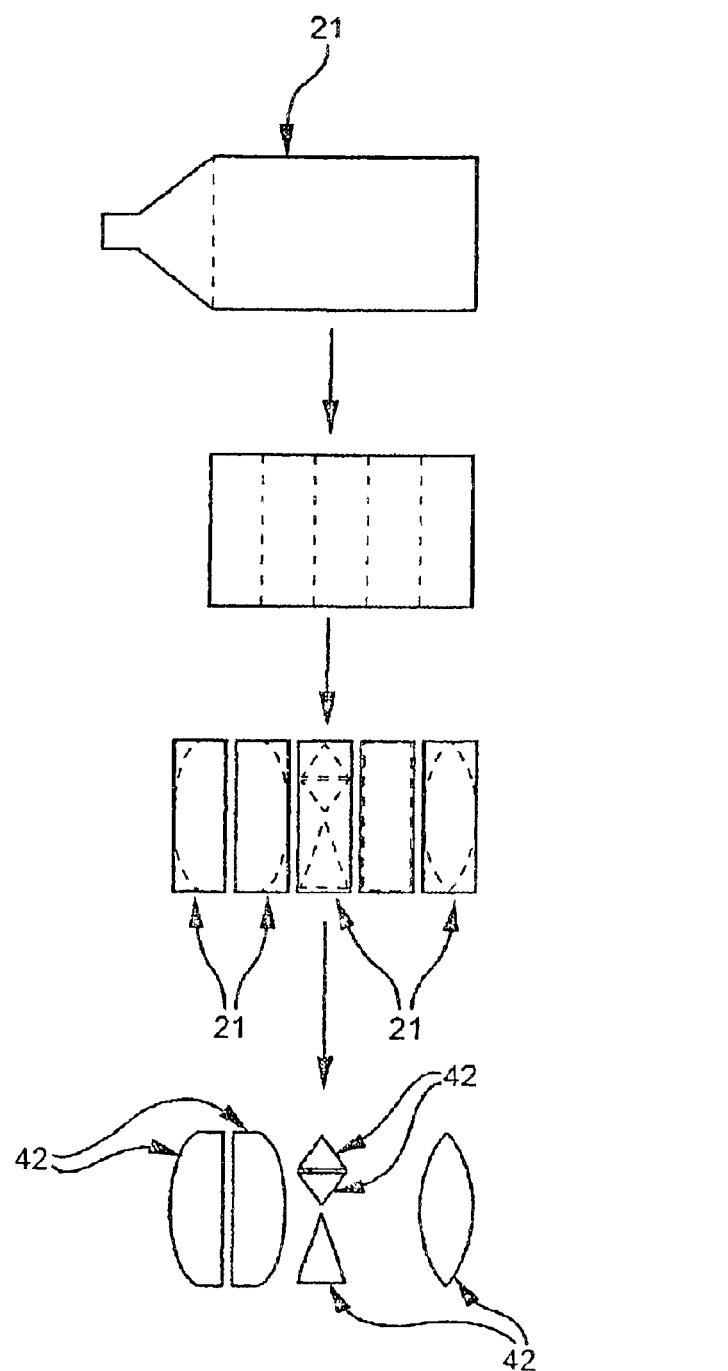
FIG. 16 shows an embodiment of the invention.

In an embodiment xnominal is not equal to x. In an embodiment xnominal is equal to x. Preferably the grown seeded oriented calcium strontium fluoride crystal has a 48 mm pathlength 157 nm external transmission ≧75%. Preferably the grown seeded oriented calcium strontium fluoride crystal has a 60% external transmission (48 mm pathlength) cutoff wavelength ≦137 nm. Preferably the grown seeded oriented calcium strontium fluoride crystal has a minimal induced absorption at 193 nm with an external transmission (16 mm pathlength)>70% after ArF excimer laser 193 nm exposure of $0.96\times10^6$ pulses at 17.5 $mJ/cm^2$. Preferably the mixed calcium strontium fluoride oriented seed crystal has a 48 mm pathlength 157 nm external transmission ≧75%. Preferably the mixed calcium strontium fluoride oriented seed crystal has a 60% external transmission (48 mm pathlength) cutoff wavelength ≦137 nm. Preferably the mixed calcium strontium fluoride oriented seed crystal has a minimal induced absorption at 193 nm with an external transmission (16 mm pathlength)>70% after ArF excimer laser 193 nm exposure of $0.96\times10^6$ pulses at 17.5 $mJ/cm^2$. Preferably said grown seeded oriented calcium strontium fluoride crystal has a stress birefringence measured at 633 nm that is less than 5 nm/cm, more preferably <2 nm/cm, more preferably <1 nm/cm. FIG. 11 shows a calcium strontium fluoride crystal growth crucible 62 having a mixed crystal growth chamber and a mixed calcium strontium seed crystal orientation receiver 64 for receiving and orienting a mixed calcium strontium seed crystal 60 in relation to the adjoining above crystal growth chamber. FIG. 12 shows a calcium strontium fluoride crystal growth crucible loaded with an orientied mixed calcium strontium seed crystal 60 and a calcium strontium fluoride crystal feedstock mixture 70. FIG. 13 shows a calcium strontium fluoride crystal growth crucible 62 containing a calcium strontium fluoride crystal feedstock mixture melt 66 with an upper portion of seed crystal 60 melted. The calcium strontium fluoride crystal mix is melted in the upper hot melt zone of controlled atmosphere vaccuum furnace 110. Controlled atmosphere/vaccuum furnace 110 is heated by resistive graphite heating elements 8. An insulating furnace baffle 14 preferably separates the upper and lower heating elements to isolate the lower cool anneal zone from the upper hot melt zone and forms therebetween a mixed calcium strontium fluoride crystal growth temperature gradient. As shown in FIGS. 14–15 the mixed calcium strontium fluoride oriented crystal seed 60, the melted upper portion of said mixed calcium strontium fluoride oriented crystal seed and melted calcium strontium fluoride crystal feedstock mixture 66 is progressively moved through a crystal growth temperature gradient to grow a seeded oriented calcium strontium fluoride crystal 21 of $Ca_xSr_{(1-x)}F_2$ with x in the range from 0.1 to 0.9. As shown in FIG. 16, seeded oriented calcium strontium fluoride crystal 21 is formed into seeded oriented calcium strontium fluoride crystal element blanks 21. Seeded oriented mixed calcium strontium fluoride crystal element blanks 21 are formed into mixed fluoride crystal optical elements 42.

As shown in FIG. 11 the invention includes providing a mixed fluoride crystal growth crucible 62 having a mixed crystal growth chamber and a mixed fluoride seed crystal orientation receiver 64 for receiving and orienting a mixed fluoride seed crystal 60 in relation to the adjoining above crystal growth chamber. As shown in FIGS. 11–16 the invention includes the making of mixed fluoride combination crystal optical element blanks for less than 200 nm wavelength optics. The making of mixed fluoride combination crystal optical element blanks includes providing a mixed fluoride crystal feedstock mixture of first alkaline earth metal cations and a plurality of second alkaline earth metal cations. FIG. 12 shows a mixed fluoride crystal growth crucible loaded with an orientied mixed fluoride seed crystal 60 and a mixed fluoride crystal feedstock mixture 70. FIG. 13 shows a mixed fluoride crystal growth crucible 62 containing a mixed fluoride crystal feedstock mixture melt 66 with an upper portion of seed crystal 60 melted. The fluoride crystal mix is melted in the upper hot melt zone of controlled atmosphere vaccuum furnace 110. An insulating furnace baffle 14 preferably separates the upper and lower heating elements to isolate the lower cool anneal zone from the upper hot melt zone and forms a mixed fluoride crystal growth temperature gradient. As shown in FIGS. 14–15 the mixed fluoride oriented crystal seed 60, the melted upper portion of said mixed fluoride oriented crystal seed and melted fluoride crystal feedstock mixture 66 is progressively moved through a crystal growth temperature gradient to grow a seeded oriented mixed fluoride crystal 21. As shown in FIG. 16, seeded oriented mixed fluoride crystal 21 is formed into seeded oriented mixed fluoride crystal element blanks 21. Seeded oriented mixed fluoride crystal element blanks 21 are formed into mixed fluoride crystal optical elements 42.

The invention includes a method of making a mixed fluoride crystal optical element blank for less than 200 nm wavelength optics. The method includes providing a calcium strontium fluoride crystal feedstock mixture of $Ca_xSr_{(1-x)}F_2$ with x in the range from 0.1 to 0.9. The method includes providing a calcium strontium fluoride crystal growth crucible having a mixed crystal growth chamber and providing a calcium strontium fluoride crystal growth furnace having an upper hot melt zone and a lower cool anneal zone. The method includes loading the calcium strontium fluoride crystal feedstock mixture into said calcium strontium fluoride crystal growth crucible and then loading the calcium strontium fluoride crystal feedstock mixture and said calcium strontium fluoride crystal growth crucible into said calcium strontium fluoride crystal growth furnace. The method includes melting said calcium strontium fluoride crystal feedstock mixture inside said calcium strontium fluoride crystal growth crucible in said crystal growth furnace upper hot zone and progressively moving said calcium strontium fluoride crystal growth crucible into said calcium strontium fluoride crystal growth furnace lower zone to grow a calcium strontium fluoride crystal of $Ca_xSr_{(1-x)}F_2$ with x in the range from 0.1 to 0.9. Preferably the grown calcium strontium fluoride crystal of $Ca_xSr_{(1-x)}F_2$ has a 48 mm pathlength 157 nm external transmission $\geq 75\%$. Preferably the grown calcium strontium fluoride crystal of $Ca_xSr_{(1-x)}F_2$ has a 60% external transmission (48 mm pathlength) cutoff wavelength $\leq 137$ nm. Preferably the grown calcium strontium fluoride crystal of $Ca_xSr_{(1-x)}F_2$ has a minimal induced absorption at 193 nm with an external transmission (16 mm pathlength)>70% after ArF excimer laser 193 nm exposure of $0.96 \times 10^6$ pulses at 17.5 mJ/cm$^2$. Preferably the method includes annealing said grown calcium strontium fluoride crystal of $Ca_xSr_{(1-x)}F_2$ to provide an annealed low stress birefringence calcium strontium fluoride crystal with a 633 nm stress birefringence <5 nm/cm, more preferably <2 nm/cm, more preferably <1 nm/cm. Preferably annealing includes cooling said grown calcium strontium fluoride crystal of $Ca_xSr_{(1-x)}F_2$ from an annealing temperature of about 850° C. to a temperature of about 20° C. over a slow cooling annealing period of at least 480 hours, more preferably at least 700 hours. In an embodiment the grown calcium strontium fluoride crystal is annealled in the lower cool anneal zone of the furnace it is grown in after moving down out of the upper hot zone and away from the thermal gradient baffled area to provide the low stress birefringence <5 nm/cm, more preferably <2 nm/cm, more preferably <1 nm/cm. In an embodiment the grown calcium strontium fluoride crystal is secondary annealled in a calcium strontium fluoride crystal secondary annealling furnace separate from the calcium strontium fluoride crystal growth furnace.

In the calcium strontium fluoride crystal secondary annealling furnace the grown calcium strontium fluoride crystal is heated to a temperature below its melting point and then slowly cooled to provide the low stress birefringence <5 nm/cm, more preferably <2 nm/cm, more preferably <1 nm/cm. Preferably secondary annealling the grown calcium strontium fluoride crystal includes heating the crystal up to an annealing temperature of about 850° C. (±50° C.) then slowly cooled to a temperature of about 20° C. over a slow cooling annealing period of at least 480 hours, more preferably at least 700 hours. In an embodiment the method includes xraying said grown calcium strontium fluoride crystal to measure the strontium mole content such as shown in FIG. 6. In an embodiment the method includes obtaining a fluorescence spectrum of said grown calcium strontium fluoride crystal such as shown in FIG. 6 and determining fitness of the grown calcium strontium fluoride crystal for use below 200 nm. Corning Incorporated U.S. patent application Ser. No. 09/803,281 (Filed Mar. 9, 2001) and published as US20020105642 A1 (Method and apparatus for evaluating the quality of an optical crystal) which is hereby incorporated by reference discloses a method for evaluating the quality of an optical fluoride crystal material by obtaining a fluorescence spectrum of the optical fluoride crystal material, obtaining a fluorescence spectrum of a reference material having desired performance in a target application, and determining whether a shape of the spectrum of the optical fluoride crystal material is similar to a shape of the spectrum of the reference material. If the shape of the spectrum of the optical material is similar to the shape of the spectrum of the reference material, the method includes indicating that the optical material is suitable for the target application; otherwise, the method includes indicating that the optical material is unsuitable for the target application. In an embodiment the x is preferably from 0.4 to 0.6 for the grown calcium strontium fluoride crystal $Ca_xSr_{(1-x)}F_2$, more preferably x is from 0.45 to 0.55. In an embodiment the x is preferably from 0.7 to 0.9 for the grown calcium strontium fluoride crystal $Ca_xSr_{(1-x)}F_2$, more preferably x is from 0.75 to 0.85.

The method of making a mixed fluoride crystal optical element blank for less than 200 nm wavelength optics is shown in FIGS. 11–16. The method includes providing a calcium strontium fluoride crystal feedstock mixture 70 of $Ca_xSr_{(1-x)}F_2$ with x in the range from 0.1 to 0.9. The method includes providing a calcium strontium fluoride crystal growth crucible 62 having a mixed crystal growth chamber and providing a calcium strontium fluoride crystal growth furnace 110 having an upper hot melt zone and a lower cool anneal zone, preferably seperated by an insulating baffle 14 with the graphite heating elements 8 providing a crystal growth thermal gradient. The method includes loading the calcium strontium fluoride crystal feedstock mixture 70 into said calcium strontium fluoride crystal growth crucible 62 and then loading the calcium strontium fluoride crystal feedstock mixture and said calcium strontium fluoride crystal growth crucible into said calcium strontium fluoride crystal growth furnace 110. The method includes forming a calcium strontium fluoride crystal feedstock mixture melt 66 inside said calcium strontium fluoride crystal growth crucible 62 in said crystal growth furnace upper hot zone and progressively moving said calcium strontium fluoride crystal growth crucible 62 into said calcium strontium fluoride crystal growth furnace lower zone to grow a calcium strontium fluoride crystal 21 of $Ca_xSr_{(1-x)}F_2$ with x in the range from 0.1 to 0.9. Preferably the grown calcium strontium fluoride crystal 21 of $Ca_xSr_{(1-x)}F_2$ has a 48 mm pathlength 157 nm external transmission ≥75%. Preferably the grown calcium strontium fluoride crystal 21 of $Ca_xSr_{(1-x)}F_2$ has a 60% external transmission (48 mm pathlength) cutoff wavelength ≤137 nm. Preferably the grown calcium strontium fluoride crystal 21 of $Ca_xSr_{(1-x)}F_2$ has a minimal induced absorption at 193 nm with an external transmission (16 mm pathlength)>70% after ArF excimer laser 193 nm exposure of $0.96\times10^6$ pulses at 17.5 mJ/cm$^2$. Preferably the method includes annealing said grown calcium strontium fluoride crystal 21 of $Ca_xSr_{(1-x)}F_2$ to provide an annealed low stress birefringence calcium strontium fluoride crystal 21 with a 633 nm stress birefringence <5 nm/cm, more preferably <2 nm/cm, more preferably <1 nm/cm. Preferably annealing includes cooling said grown calcium strontium fluoride crystal 21 of $Ca_xSr_{(1-x)}F_2$ from an annealing temperature of about 850° C. to a temperature of about 20° C. over a slow cooling annealing period of at least 480 hours, more preferably at least 700 hours. In an embodiment the grown calcium strontium fluoride crystal 21 is annealed in the crucible 62 and in the lower cool anneal zone of the furnace it is grown in after moving down out of the upper hot zone and away from the thermal gradient baffled area 14 to provide the low stress birefringence <5 nm/cm, more preferably <2 nm/cm, more preferably <1 nm/cm. In an embodiment the grown calcium strontium fluoride crystal 21 is secondary annealed in a calcium strontium fluoride crystal secondary annealling furnace separate from the calcium strontium fluoride crystal growth furnace. In the calcium strontium fluoride crystal secondary annealling furnace the grown calcium strontium fluoride crystal 21 is heated to a temperature below its melting point and then slowly cooled to provide the low stress birefringence <5 nm/cm, more preferably <2 nm/cm, more preferably <1 nm/cm. Preferably secondary annealling the grown calcium strontium fluoride crystal 21 includes heating the crystal up to an annealing temperature of about 850° C. (±50° C.) then slowly cooled to a temperature of about 20° C. over a slow cooling annealing period of at least 480 hours, more preferably at least 700 hours. In an embodiment the grown crystal ingot is seperated into separate smaller crystal blanks for optical elements prior to being secondary annealled. In an embodiment the x is preferably from 0.4 to 0.6 for the grown calcium strontium fluoride crystal $Ca_xSr_{(1-x)}F_2$, more preferably x is from 0.45 to 0.55. In an embodiment the x is preferably from 0.7 to 0.9 for the grown calcium strontium fluoride crystal $Ca_xSr_{(1-x)}F_2$, more preferably x is from 0.75 to 0.85.

As shown in FIGS. 11–16 the invention includes the making of mixed fluoride combination crystal optical element blanks for less than 200 nm wavelength optics. The making of mixed fluoride combination crystal optical element blanks includes providing a mixed fluoride crystal feedstock mixture of first alkaline earth metal cations and a plurality of second alkaline earth metal cations. The method includes providing a mixed fluoride combination crystal growth crucible 62 having a mixed crystal growth chamber and providing a mixed fluoride crystal growth furnace 110 having an upper hot melt zone and a lower cool anneal zone, preferably seperated by an insulating baffle 14 with the graphite heating elements 8 providing a crystal growth thermal gradient. The method includes loading the mixed fluoride crystal feedstock mixture 70 of first alkaline earth metal cations and second alkaline earth metal cations into said fluoride crystal growth crucible 62 and then loading the fluoride crystal feedstock mixture and said fluoride crystal growth crucible into said fluoride crystal growth furnace 110. The method includes forming a fluoride crystal feedstock mixture melt 66 inside said fluoride crystal growth crucible 62 in said crystal growth furnace upper hot zone and progressively moving said fluoride crystal growth crucible 62 into said fluoride crystal growth furnace lower zone to grow a fluoride crystal 21. Preferably the method includes annealing said grown fluoride crystal 21 to provide an annealed low stress birefringence fluoride mixed combinatin crystal 21 with a 633 nm stress birefringence <5 nm/cm, more preferably <2 nm/cm, more preferably <1 nm/cm. Preferably annealing includes cooling said grown mixed fluoride crystal 21 from an annealing temperature of about 850° C. to a temperature of about 20° C. over a slow cooling annealing period of at least 480 hours, more preferably at least 700 hours. In an embodiment the grown fluoride crystal 21 is annealled in the crucible 62 and in the lower cool anneal zone of the furnace it is grown in after moving down out of the upper hot zone and away from the thermal gradient baffled area 14 to provide the low stress birefringence <5 nm/cm, more preferably <2 nm/cm, more preferably <1 nm/cm. In an embodiment the grown mixed combination fluoride crystal 21 is secondary annealed in a fluoride crystal secondary annealling furnace separate from the fluoride crystal growth furnace 110. In the secondary annealling furnace the grown fluoride crystal 21 is heated to a temperature below its melting point and then slowly cooled to provide the low stress birefringence <5 nm/cm, more preferably <2 nm/cm, more preferably <1 nm/cm. Preferably secondary annealling the grown mixed fluoride crystal 21 includes heating the crystal up to an annealing temperature of about 850° C. (±50° C.) then slowly cooling to a temperature of about 20° C. over a slow cooling annealing period of at least 480 hours, more preferably at least 700 hours. In an embodiment the grown mixed crystal ingot is seperated into separate smaller crystal blanks for optical elements prior to being secondary annealled.

The present invention overcomes problems in the prior art and provides a means for economically manufacturing high quality crystals that can be used to improve the manufacturing of integrated circuits with ultraviolet wavelengths below 200-nm. It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A Method of making a mixed fluoride crystal optical element blank for less than 200 nm wavelength optics, said method including:

providing a calcium strontium fluoride crystal feedstock mixture, providing a mixed calcium strontium fluoride oriented crystal seed of $Ca_xSr_{(1-x)}F_2$ with x in the range from 0.1 to 0.9, providing a calcium strontium fluoride crystal growth crucible having a mixed crystal growth chamber and a mixed calcium strontium seed crystal orientation receiver for receiving and orienting a mixed calcium strontium seed crystal in relation to said crystal growth chamber, loading said mixed calcium strontium fluoride oriented crystal seed into said seed crystal receiver, loading said calcium strontium fluoride crystal feedstock mixture into said calcium strontium fluoride crystal growth crucible, melting said calcium strontium fluoride crystal feedstock mixture and an upper portion of said mixed calcium strontium fluoride oriented crystal seed, progressively moving said mixed calcium strontium fluoride oriented crystal seed, said melted upper portion of said mixed calcium strontium fluoride oriented crystal seed, and said melted calcium strontium fluoride crystal feedstock mixture trough a crystal growth temperature gradient to grow a seeded oriented calcium strontium fluoride crystal of $Ca_xSr_{(1-x)}F_2$ with x in the range from 0.1 to 0.9.

2. A method as claimed in claim 1 wherein said mixed calcium strontium fluoride oriented crystal seed is a 100 oriented optical fluoride seed crystal.

3. A method as claimed in claim 1 wherein said mixed calcium strontium fluoride oriented crystal seed is a 110 oriented optical fluoride seed crystal.

4. A method as claimed in claim 1 wherein said mixed calcium strontium fluoride oriented crystal seed is a 111 oriented optical fluoride seed crystal.

5. A method as claimed in claim 1 wherein said grown seeded oriented calcium strontium fluoride crystal has a stress birefringence (633 nm)<5 nm/cm.

6. A method as claimed in claim 1 wherein said grown seeded oriented calcium strontium fluoride crystal has a 48 mm pathlength 157 nm external transmission ≧75%.

7. A method as claimed in claim 1 wherein said grown seeded oriented calcium strontium fluoride crystal has a 60% external transmission (48 mm pathlength) cutoff wavelength ≦137 nm.

8. A method as claimed in claim 1 wherein said grown seeded oriented calcium strontium fluoride crystal has a minimal induced absorption at 193 nm with an external transmission (16 mm pathlength)>70% after ArF excimer laser 193 nm exposure of $0.96 \times 10^6$ pulses at 17.5 $mJ/cm^2$.

9. A method as claimed in claim 1 wherein said mixed calcium strontium fluoride oriented seed crystal has a 48 mm pathlength 157 nm external transmission ≧75%.

10. A method as claimed in claim 1 wherein said mixed calcium strontium fluoride oriented seed crystal has a 60% external transmission (48 mm pathlength) cutoff wavelength ≦137 nm.

11. A method as claimed in claim 1 wherein said mixed calcium strontium fluoride oriented seed crystal has a minimal induced absorption at 193 nm with an external transmission (16 mm pathlength)>70% after ArF excimer laser 193 nm exposure of $0.96 \times 10^6$ pulses at 17.5 $mJ/cm^2$.

12. A Method of making a mixed fluoride crystal optical element blank for less than 200 nm wavelength optics, said method including:

providing a calcium strontium fluoride crystal feedstock mixture of $Ca_xSr_{(1-x)}F_2$ with x in the range from 0.1 to 0.9, providing a calcium strontium fluoride crystal growth crucible having a mixed crystal growth chamber, providing a calcium strontium fluoride crystal growth furnace having an upper hot melt zone and a lower cool anneal zone, loading said calcium strontium fluoride crystal feedstock mixture into said calcium strontium fluoride crystal growth crucible, loading said calcium strontium fluoride crystal feedstock mixture and said calcium strontium fluoride crystal growth crucible into said calcium strontium fluoride crystal growth furnace, melting said calcium strontium fluoride crystal feedstock mixture inside said calcium strontium fluoride crystal growth crucible in said crystal growth furnace upper hot zone, progressively moving said calcium strontium fluoride crystal growth crucible into said calcium strontium fluoride crystal growth furnace lower zone to grow a calcium strontium fluoride crystal of $Ca_xSr_{(1-x)}F_2$ with x in the range from 0.1 to 0.9.

13. A method as claimed in claim 12 wherein said grown calcium strontium fluoride crystal of $Ca_xSr_{(1-x)}F_2$ has a 48 mm pathlength 157 nm external transmission ≧75%.

14. A method as claimed in claim 12 wherein said grown calcium strontium fluoride crystal of $Ca_xSr_{(1-x)}F_2$ has a 60% external transmission (48 mm pathlength) cutoff wavelength ≦137 nm.

15. A method as claimed in claim 12 wherein said grown calcium strontium fluoride crystal of $Ca_xSr_{(1-x)}F_2$ has a minimal induced absorption at 193 nm with an external transmission (16 mm pathlength)>70% after ArF excimer laser 193 nm exposure of $0.96 \times 10^6$ pulses at 17.5 $mJ/cm^2$.

16. A method as claimed in claim 12, said method including annealing said grown calcium strontium fluoride crystal of $Ca_xSr_{(1-x)}F_2$ to provide an annealed low stress birefringence calcium strontium fluoride crystal with a stress birefringence (633 nm)<5 nm/cm.

17. A method as claimed in claim 16, wherein annealing includes cooling said grown calcium strontium fluoride crystal of $Ca_xSr_{(1-x)}F_2$ from an annealing temperature of 850° C. to 20° C. over a period of at least 480 hours.

18. A method as claimed in claim 12, said method including xraying said grown calcium strontium fluoride crystal to measure the strontium mole content.

19. A method as claimed in claim 12, said method including obtaining a fluorescence spectrum of said grown calcium strontium fluoride crystal.

20. A method as claimed in claim 12 wherein x is from 0.4 to 0.6.

21. A method as claimed in claim 12 wherein x is from 0.45 to 0.55.

22. A method as claimed in claim 12 wherein x is from 0.7 to 0.9.

23. A method as claimed in claim 12 wherein x is from 0.75 to 0.85.

* * * * *